United States Patent [19]

Itabashi et al.

[11] Patent Number: 5,391,894
[45] Date of Patent: Feb. 21, 1995

[54] STATIC RANDOM ACCESS MEMORY DEVICE HAVING THIN FILM TRANSISTOR LOADS

[75] Inventors: Kazuo Itabashi; Taiji Ema, both of Kawasaki, Japan

[73] Assignee: Fujitsu Limited, Kawasaki, Japan

[21] Appl. No.: 90,640

[22] Filed: Jul. 13, 1993

Related U.S. Application Data

[63] Continuation of Ser. No. 844,223, Mar. 2, 1992, abandoned.

[30] Foreign Application Priority Data

Mar. 1, 1991 [JP] Japan .................. 3-078719
Jun. 18, 1991 [JP] Japan .................. 3-145940

[51] Int. Cl.$^6$ ............................ H01L 29/04
[52] U.S. Cl. ..................... 257/67; 257/393; 257/385; 257/401; 257/903
[58] Field of Search ............ 357/59 E, 42, 51, 71 P, 357/23.7; 257/67, 393, 903, 385, 401

[56] References Cited

U.S. PATENT DOCUMENTS

| 4,975,875 | 12/1990 | Ito | 257/383 |
|---|---|---|---|
| 5,028,975 | 7/1991 | Nagasawa et al. | 357/42 |
| 5,132,771 | 7/1992 | Yamanaka et al. | 257/390 |
| 5,239,196 | 8/1993 | Ikeda et al. | 257/903 |

FOREIGN PATENT DOCUMENTS

| 59-231851 | 12/1984 | Japan | 357/23.6 |
|---|---|---|---|
| 62-203363 | 9/1987 | Japan | . |
| 64-82559 | 3/1989 | Japan | . |
| 1-144655 | 6/1989 | Japan | . |
| 2-312271 | 12/1990 | Japan | . |

*Primary Examiner*—Robert P. Limanek
*Attorney, Agent, or Firm*—Staas & Halsey

[57] ABSTRACT

A semiconductor memory device includes a semiconductor substrate, a memory cell formed on the semiconductor substrate and including first and second transfer transistors, first and second driver transistors and first and second thin film transistor loads, and first and second word lines extending generally parallel to each other along a predetermined direction and respectively coupled to gate electrodes of the first and second transfer transistors. Each of the first and second thin film transistor loads include first and second impurity regions which sandwich a channel region formed by a semiconductor layer provided on the semiconductor substrate, and a gate electrode formed by confronting conductor layers and isolated from the channel region. The first driver transistor includes a drain which is coupled to one of the impurity regions of the first thin film transistor load and to a gate of the second driver transistor via a first connection region, and the second driver transistor includes a drain which is coupled to one of the impurity regions of the second thin film transistor load and to a gate of the first driver transistor via a second connection region. The first and second connection regions are independently provided and have the same structure.

16 Claims, 73 Drawing Sheets

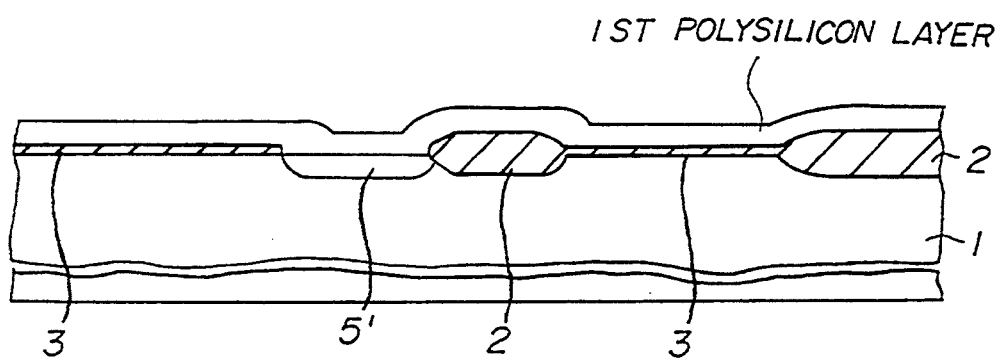
FIG. IC PRIOR ART

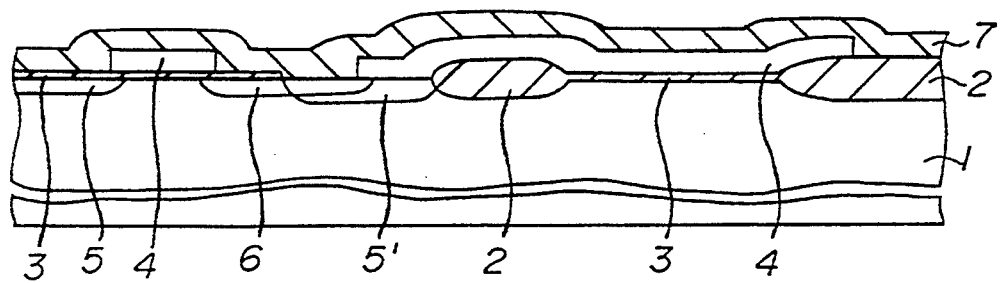
FIG. IE PRIOR ART

FIG. IH PRIOR ART
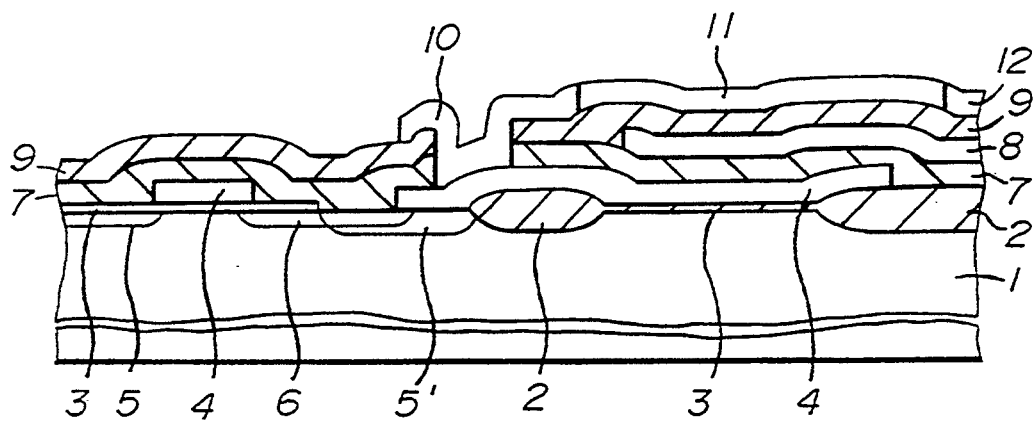

STATIC RANDOM ACCESS MEMORY DEVICE HAVING THIN FILM TRANSISTOR LOADS

This application is a continuation of U.S. patent application Ser. No. 07/844,223, filed Mar. 2, 1992, now abandoned.

BACKGROUND OF THE INVENTION

The present invention generally relates to semiconductor memory devices and methods of producing the same, and more particularly to a thin film transistor (TFT) load type static random access memory (SRAM) and a method of producing such a TFT load type SRAM.

Up to now, the high resistance load type SRAM was popularly used. However, as the integration density improves and the number of memory cells increases, the current consumption increases and various problems are generated. In order to avoid such problems and with progress in the semiconductor technology, the SRAM having the TFT load has been realized. However, new problems are generated due to the use of the TFT load, and it is necessary to eliminate these new problems.

An example of a conventional method of producing the high resistance load type SRAM will be described with reference to FIGS. 1A through 1J and FIGS. 2A through 2F. FIGS. 1A through 1J are side views in cross section showing essential parts of the high resistance load type SRAM at essential stages of the conventional method of producing the high resistance load type SRAM. FIGS. 2A through 2F are plan views of the high resistance load type SRAM at essential stages of the conventional method of producing the high resistance load type SRAM. FIGS. 1A through 1J respectively are cross sections taken along a line which corresponds to a line Y—Y in the plan view of FIG. 2F.

In FIG. 1A, a silicon dioxide ($SiO_2$) layer is used as a pad layer, for example, and a silicon nitride ($Si_3N_4$) layer which is formed on the $SiO_2$ layer is used as an oxidation resistant mask layer when carrying out a selective thermal oxidation (for example, a local oxidation of silicon (LOCOS)) so as to form a field insulator layer 2 on a silicon (Si) semiconductor substrate 1. This field insulator layer 2 is made of $SiO_2$ and has a thickness of 4000 Å, for example.

Then, the $Si_3N_4$ layer and the $SiO_2$ layer which are used when carrying out the selective thermal oxidation are removed to expose an active region of the Si semiconductor substrate 1.

In FIG. 1B, a thermal oxidation is carried out to form a gate insulator layer 3 which is made of $SiO_2$ and has a thickness of 100 Å, for example.

By carrying out a resist process of the photolithography technique and a wet etching using hydrofluoric acid as the etchant, the gate insulator layer 3 is selectively etched to form a contact hole 3A.

In FIGS. 1C and 2A, a chemical vapor deposition (CVD) is carried out to form a first polysilicon layer having a thickness of 1500 Å, for example.

Then, a vapor phase diffusion is carried out to introduce phosphorus (P) of $1 \times 10^{20}$ cm$^{-3}$ for example, so as to form an $n^+$-type impurity region 5'.

In FIG. 2A, the illustration of the first polysilicon layer is omitted for the sake of convenience.

In FIG. 1D, a resist process of the photolithography technique and a reactive ion etching (RIE) using $CCl_4/O_2$ as the etching gas are carried out to pattern the first polysilicon layer and form a gate electrode 4. The gate electrode 4 becomes the gate electrode of a word line driver transistor.

An ion implantation is carried out to inject As ions with a dosage of $3 \times 10^{15}$ cm$^{-2}$ and an acceleration energy of 40 keV, so as to form a source region 5 and a drain region 6.

In FIGS. 1E and 2B, a CVD is carried out to form an insulator layer 7 which is made of $SiO_2$ and has a thickness of 1000 Å, for example.

By carrying out a resist process of the photolithography technique and a RIE using $CHF_3$/He as the etching gas, a ground line contact hole 7A is formed. This ground line contact hole 7A cannot be seen in FIG. 1E.

In FIG. 1F, a CVD is carried out to form a second polysilicon layer having a thickness of 1500 Å, for example.

Then, an ion implantation is carried out to inject P ions into the second polysilicon layer with a dosage of $4 \times 10^{15}$ cm$^{-2}$ and an acceleration energy of 30 keV, and an annealing is carried out to reduce the resistance.

A resist process of the photolithography technique and a RIE using $CCl_4/O_2$ as the etching gas are carried out to pattern the second polysilicon layer and form a ground line 8.

In FIGS. 1G and 2C, a CVD is carried out to form an insulator layer 9 which is made of $SiO_2$ and has a thickness of 1000 Å, for example.

A resist process of the photolithography technique and a RIE using $CHF_3$/He as the etching gas are carried out to selectively etch the insulator layers 9 and 7 and form a load resistor contact hole 9A.

In FIG. 1H, a CVD is carried out to form a third polysilicon layer having a thickness of 1500 Å, for example.

A resist process of the photolithography technique and an ion implantation with a dosage of $1 \times 10^{15}$ cm$^{-2}$ and an acceleration energy of 30 keV are carried out to inject As ions into a part where a supply line of a positive power source voltage Vcc is formed and a part where the high resistance load makes contact with the gate electrode 4.

By carrying out a resist process of the photolithography technique and a RIE using $CCl_4/O_2$ as the etching gas, the third polysilicon layer is patterned to form a contact part 10, a high resistance load 11 and a Vcc supply line 12.

In FIGS. 1I and 2D, a CVD is carried out to form an insulator layer which is made of $SiO_2$ and has a thickness of 1000 Å, for example, and an insulator layer which is made of phosphosilicate glass (PSG) and has a thickness of 5000 Å, for example. In FIG. 1I, these insulator layers are referred to as an insulator layer 13.

A thermal process is thereafter carried out to reflow and planarize the insulator layer 13.

Next, a resist process of the photolithography technique and a RIE using $CHF_3$/He as the etching gas are carried out to selectively etch the insulator layer 13 and the like and to form a bit line contact hole 13A.

In FIGS. 1J and 2E, a sputtering is carried out to form an aluminum (Al) layer having a thickness of 1 μm, for example. This Al layer is patterned using the normal photolithography technique so as to form a bit line 14. Those elements which are shown in FIGS. 1J and 2E but not yet described, such as "BL" will be readily understood from the description given later in conjunction with FIG. 3.

FIG. 2F shows the plan view of the essential part of the high resistance load type SRAM which is completed by the above described processes. In FIG. 2F, those parts which are the same as those corresponding parts in FIGS. 1A through 1J and FIGS. 2A through 2E are designated by the same reference numerals. However, for the sake of convenience, the illustration of the Al bit line 14 shown in FIGS. 1J and 2E is omitted in FIG. 2F.

FIG. 3 shows an equivalent circuit diagram of the essential part of the high resistance load type SRAM described above in conjunction with FIGS. 1A through 1J and 2A through 2F.

FIG. 3 shows driver transistors Q1 and Q2, transfer gate transistors Q3 and Q4, high resistance loads R1 and R2, a word line WL, bit lines BL and/BL, nodes S1 and S2, the positive power source voltage Vcc, and a negative power source voltage Vss.

The operation of this high resistance load type SRAM, the storage operation in particular, is carried out as follows.

If it is assumed that the positive power source voltage Vcc is 5 V, the negative power source voltage Vss is 0 V, the node S1 is 5 V and the node S2 is 0 V, the transistor Q2 is ON and the transistor Q1 is OFF. The potential at the node S1 is maintained to 5 V if the transistor Q1 is OFF and the resistance is sufficiently high compared to the high resistance load R1. The potential at the node S2 is maintained to 0 V if the transistor Q2 is ON and the resistance is sufficiently low compared to the high resistance load R2.

However, under the above described condition, a D.C. current flows from the positive power source voltage Vcc supply line to the negative power source voltage Vss supply line via the node S2, and the current value is inversely proportional to the value of the high resistance load R2.

When the integration density of the above described high resistance load type SRAM increases, the number of memory cells per chip increases and the current consumption of the entire chip would become very large if the current consumption per memory is not reduced. Hence, the D.C. current described above must be reduced, but in order to reduce this D.C. current, the values of the high resistance loads R1 and R2 must be set large. However, when the values of the high resistance loads R1 and R2 are set large, it becomes difficult to stably maintain the potential at the node having the driver transistor which is OFF, that is, the potential at the node S1 in FIG. 3.

Because of the above described background, the TFT load type SRAM which uses the TFT as the load in place of the high resistance load has been developed.

Next, a description will be given of the TFT load type SRAM. Similarly to the description given above in respect of the high resistance load type SRAM, a description will first be given of the method of producing the TFT load type SRAM.

An example of a conventional method of producing the TFT load type SRAM will be described with reference to FIGS. 4A through 4D and FIGS. 5A through 5D. FIGS. 4A through 4D are side views in cross section showing essential parts of the TFT load type SRAM at essential stages of the conventional method of producing the high resistance load type SRAM. FIGS. 5A through 5D are plan views of the TFT load type SRAM at essential stages of the conventional method of producing the TFT load type SRAM. FIGS. 4A through 4D respectively are cross sections taken along a line which corresponds to a line Y—Y in the plan view of FIG. 5D.

The processes of producing the TFT load type SRAM at the beginning are basically the same as the processes described in conjunction with FIGS. 1A through 1G up to the process of forming the load resistor contact hole 9A of the high resistance load type SRAM, and a description thereof will be omitted. The only difference is that a contact hole 8A shown in FIG. 5A is formed with respect to the ground line 8 which is made of the second polysilicon layer, so that a gate electrode of a TFT which is formed by a third polysilicon layer can make contact with an active region and the gate electrode 4 which is formed by the first polysilicon layer. Hence, a description will only be given from the processes thereafter. In FIGS. 4A through 4D and 5A through 5D, those parts which are the same as those corresponding parts in FIGS. 1A through 1J and 2A through 2F are designated by the same reference numerals.

In FIGS. 4A and 5A, a CVD is carried out to form a third polysilicon layer having a thickness of 1500 Å, for example.

Then, an ion implantation is carried out to inject P ions with a dosage of $4 \times 10^{15}$ cm$^{-2}$ and an acceleration energy of 30 keV.

Further, a resist process of the photolithography technique and a RIE using $CCl_4/O_2$ as the etching gas are carried out to pattern the third polysilicon layer and form a gate electrode 15 of the TFT.

In FIG. 4B, a CVD is carried out to form a gate insulator layer 16 of the TFT, which is made of $SiO_2$ and has a thickness of 300 Å, for example.

A resist process of the photolithography technique and a wet etching using hydrofluoric acid as the etchant are carried out to selectively etch the gate insulator layer 16 and form a drain contact hole 16A.

In FIGS. 4C and 5B, a CVD is carried out to form a fourth polysilicon layer having a thickness of 500 Å, for example. In addition, an ion implantation is carried out to inject impurities into the fourth polysilicon layer to form a source and a drain of the TFT.

A resist process of the photolithography technique and a RIE using $CCl_4/O_2$ as the etching gas are carried out to pattern the fourth polysilicon layer and form a source region 17, a drain region 18 and a channel region 19 of the TFT and also form a Vcc supply line 20.

In FIGS. 4D and 5C, a CVD is carried out to form an insulator layer made of $SiO_2$ and having a thickness of 1000 Å, for example, and an insulator layer made of PSG and having a thickness of 5000 Å, for example. In FIG. 4D, these two insulator layers are shown as one insulator layer 21, similarly as in the case of FIGS. 1I and 1J.

Then, a thermal process is carried out to reflow and planarize the insulator layer 21.

Next, a resist process of the photolithography technique and a RIE using $CHF_3/He$ as the etching gas are carried out to selectively etch the insulator layer 21 and the like and to form a bit line contact hole.

A sputtering is carried out thereafter to form an Al layer having a thickness of 1 μm, for example, and this Al layer is patterned by the normal photolithography technique to form a bit line 22. Those elements which are shown in FIGS. 4D and 5C but not yet described such as "BL" will be readily understood from the description given later in conjunction with FIG. 6.

FIG. 5D shows the plan view of the essential part of the TFT load type SRAM which is completed by the above described processes. In FIG. 5D, those parts which are the same as those corresponding parts in FIGS. 4A through 4D and FIGS. 5A through 5D are designated by the same reference numerals. However, for the sake of convenience, the illustration of the Al bit line 22 shown in FIGS. 4D and 5C is omitted in FIG. 5D.

FIG. 6 shows an equivalent circuit diagram of an essential part of the TFT load type SRAM described in conjunction with FIGS. 4A through 4D and 5A through 5D. In FIG. 6, those parts which are the same as those corresponding parts in FIGS. 4A through 4D and 5A through 5D are designated by the same reference numerals.

FIG. 6 shows transistors Q5 and Q6 which are load TFTs used in place of the high resistance loads R1 and R2 shown in FIG. 3.

Next, a description will be given of the operation of the TFT load type SRAM, and the storing operation in particular.

If it is assumed that the positive power source voltage Vcc is 5 V, the negative power source voltage Vss is 0 V, the node S1 is 5 V and the node S2 is 0 V, the transistor Q6 is OFF when the transistor Q2 is ON and the transistor Q5 is ON when the transistor Q1 is OFF. The potential at the node S1 is maintained to 5 V if the transistor Q1 is OFF and the resistance is sufficiently high compared to the transistor Q5 which is ON. The potential at the node S2 is maintained to 0 V if the transistor Q2 is ON and the resistance is sufficiently small compared to the transistor Q6 which is ON.

Under the above described condition, the resistance of the load transistor Q5 or Q6 changes depending on the stored information, and thus, the problems of the high resistance load type SRAM is eliminated. That is, it is possible to carry out a stable information storage operation. The channels of the transistors Q5 and Q6, that is, the channels of the load TFTs, are made of polysilicon. The crystal state of the polysilicon which forms the channels is considerably poor compared to the single crystal, and a current easily leaks even when the transistor is OFF. Such a leak current increases the current consumption of the chip, and it is desirable to make the channel as small as possible.

On the other hand, as may be readily seen from FIG. 4D, the bit line 22 which is made of the Al layer is provided at the top layer of the TFT load type SRAM. In addition, the channel of the load TFT exists immediately under the bit line 22 via the insulator layer 21 which is made of PSG or the like.

But according to this construction, the bit line 22 which is made of the Al layer can be regarded as a gate electrode of a transistor, and the underlying insulator layer 21 can be regarded as a gate insulator layer of this transistor. In addition, the potential of the bit line 22 which is regarded as the gate electrode varies between 0 v (Vss) and 5 V (Vcc). As a result, the TFT which should be OFF, that is, the transistor Q6 becomes nearly ON, and the leak current increases and the parasitic effect becomes notable.

Accordingly, a double gate structure TFT load type SRAM was developed in order to eliminate the above described problems of the TFT load type SRAM.

According to the double gate structure TFT load type SRAM, the above described problems of the TFT load type SRAM are eliminated by interposing the third polysilicon layer of the TFT load type SRAM described in conjunction with FIGS. 4 through 6 between the fourth polysilicon layer and the bit line 22 which is made of Al. Particularly, a fifth polysilicon layer forming a second gate electrode which has the same pattern as the gate electrode 15 of the TFT is interposed between the Al bit line 22 and the fourth polysilicon layer which forms the source region 17, the drain region 18, the channel region 19, the Vcc supply line 20 and the like.

FIGS. 7A through 7C are side views in cross section showing essential parts of the double gate structure TFT load type SRAM at essential stages of the conventional method of producing the double gate structure TFT load type SRAM. The processes of producing the double gate structure TFT load type SRAM at the beginning are basically the same as the processes described in conjunction with FIGS. 4A through 4C up to the process of forming the source region 17, the drain region 18, the channel region 19 and the Vcc supply line 20 of the TFT load type SRAM, and a description thereof will be omitted. Hence, a description will only be given from the processes thereafter. In FIGS. 7A through 7C, those parts which are the same as those corresponding parts in FIGS. 1 through 6 are designated by the same reference numerals.

In FIG. 7A, a CVD is carried out to form an insulator layer 23 which is made of $SiO_2$ and has a thickness of 500 Å, for example.

A resist process of the photolithography technique and a RIE using $CHF_3 + He$ as the etching gas are carried out to selectively etch the insulator layer 23 and to form a contact hole 23A with respect to the drain electrode 18 of the TFT.

In FIG. 7B, a CVD is carried out to form a fifth polysilicon layer having a thickness of 1000 Å, for example.

Then, an ion implantation is carried out to inject P ions into the fifth polysilicon layer with a dosage of $4 \times 10^{15}$ cm$^{-2}$, for example A resist process of the photolithography technique and a RIE using $CCl_4/O_2$ as the etching gas are carried out to pattern the fifth polysilicon layer and to form a second gate electrode 24 of the TFT.

In FIG. 7C, a CVD is carried out to form an insulator layer which is made of $SiO_2$ and has a thickness of 1000 Å, for example, and an insulator layer which is made of PSG and has a thickness of 5000 Å, for example. As in the case shown in FIG. 4D, these two insulator layers are shown as one insulator layer 25 in FIG. 7C.

Thereafter, a thermal process is carried out to reflow and planarize the insulator layer 25.

Next, a resist process of the photolithography technique and a RIE using $CHF_3/He$ as the etching gas are carried out to selectively etch the insulator layer 25 and the like, and to form a bit line contact hole.

In addition, a sputtering is carried out to form an Al layer having a thickness of 1 μm, for example, and this Al layer is patterned by the normal photolithography technique so as to form a bit line 26.

As described heretofore, the SRAM started from the high resistance load type, evolved to the TFT load type, and further evolved to the double gate structure TFT load type. However, as may be seen by comparing FIGS. 1A through 1J with FIGS. 7A through 7C, and FIGS. 1J and 7C in particular, the number of polysilicon layers has increased by two from the high resistance load type SRAM to the double gate structure TFT load type SRAM, and the number of mask processes have increased by four.

Next, a description will be given of the other problems of the conventional double gate structure TFT load type SRAM.

FIG. 8 is a plan view showing an essential part of the conventional TFT load type SRAM at an essential stage of the production process thereof. In FIG. 8, those parts which are the same as those corresponding parts in FIG. 5A are designated by the same reference numerals.

FIG. 8 is similar to FIG. 5A, and three kinds of contact holes H1, H2 and H3 are provided with respect to one memory cell. This means that each of the three contact holes HI through H3 must be formed by three or four processes, and moreover, the structure is different among the contact holes HI through H3. More particularly, the n+-type impurity region 5', the first polysilicon layer, the third polysilicon layer, the fourth polysilicon layer and the fifth polysilicon layer must be mutually connected at the contact hole H1. The n+-type impurity region 5', the first polysilicon layer, the third polysilicon layer and the fifth polysilicon layer must be mutually connected at the contact hole H2. Further, the n+-type impurity region 5', the first polysilicon layer and the fourth polysilicon layer must be mutually connected at the contact hole H3.

In other words, the layer which is to be etched when forming the contact hole for making contact with the fifth polysilicon layer which becomes the second gate electrode 24 of the TFT, is the gate insulator layer 16 of the TFT which is provided between the fourth polysilicon and fifth polysilicon layers for the contact holes H1 and H3. On the other hand, the layer which is to be etched is the insulator layer existing in (the third and fourth polysilicon layers)+(the fourth and fifth polysilicon layers) for the contact hole H2, and this layer which is to be etched for the contact hole H2 is considerably thick compared to the layer which is to be etched for the contact holes H1 and H3.

Hence, the contact hole H3 is conventionally constructed to mutually connect the n+-type impurity region 5', the first polysilicon layer, the third polysilicon layer, the fourth polysilicon layer and the fifth polysilicon layer, so that the contact holes H3 and H1 may use the same construction. That is, the contact holes H1 and H3 are constructed to mutually connect the n+-type impurity region 5', the first polysilicon layer, the third polysilicon layer, the fourth polysilicon layer and the fifth polysilicon layer. In addition, the thickness of the insulator layers are made approximately the same where possible to realize approximately the same etching at the two contact holes H1 and H3. On the other hand, the contact hole H2 is constructed to mutually connect the n+-type impurity region 5', the first polysilicon layer, the third polysilicon layer and the fifth polysilicon layer. As may be seen from FIG. 5B, the fourth polysilicon layer cannot be arranged at the contact hole H2, because the source electrode of the TFT formed by the fourth polysilicon layer and having a different potential is arranged extremely closed to the contact hole H2. Therefore, it is extremely difficult to match the thickness of the insulator layers at the contact holes H1 and H2.

In order to improve the production yield of the double gate structure TFT load type SRAM which is extremely fine and has a large integration density, it is necessary to reduce the number of contact holes per memory cell. In addition, when forming the contact hole, the control of the etching becomes complex if the thickness of the insulator layer which is to be etched differs depending on the contact hole, and the margin of the process becomes small. That is, it is difficult to improve the production yield of the fine semiconductor element unless there is only one kind of contact hole which is to be formed simultaneously and the number of contact holes is relatively small. For example, if the non-defective rate Of one contact hole is denoted by p and the total number of memory cells is denoted by N, the non-defective rate P as a whole can be described by the following for the case where three contact holes are provided with respect to one memory cell.

$$P_3 = (p^3)^N = p^{3N}$$

The non detective rate P as a whole can be described by the following for the case where two contact holes are provided with respect to one memory cell.

$$P_2 = (p^2)^N = p^{2N}$$

If p=0.999999 (that is, 99.9999% are non-defective), for example, $P_3$=99.7% and $P_2$=99.8% for N=1024 (1 kb), and $P_3$=4.3% and $P_2$=12.3% for N=1024×1024 (1 Mb). Therefore, the larger the value of N is or the larger the integration density is, the larger the effect the number of contact hole has on the production yield of the double gate structure TFT load type SRAM.

On the other hand, although not directly related to the double gate structure TFT load type SRAM, a description will be given of the problems which are generated when forming extremely fine semiconductor elements.

FIG. 9 is a plan view showing an essential part of a semiconductor device at an essential stage of the production process thereof, for explaining the formation of a field insulator layer which surrounds an active region using a selective thermal oxidation.

FIG. 9 shows an oxidation resistant mask layer 31 made of $Si_3N_4$, a field insulator layer 32 made of $SiO_2$, an edge 32A of the field insulator layer 32, and an active region 33. In addition, "a" and "b" indicate the lengths of the bird's beaks, and "x" indicates the width of the oxidation resistant mask layer 31.

Generally, the width of the active region 33 becomes greatly dependent on the pattern of the bird's beak when the width of the active region 33 becomes 1 μm or less. Particularly as shown in FIG. 9, when the oxidation resistant mask layer 31 includes a dead end pattern, the length "b" of the bird's beak which projects becomes extremely large. The width of the active region 33 should originally be equal to the width "x" of the oxidation resistant mask layer 31, but the width of the active region 33 becomes narrow due to the generation of the bird's beak.

FIG. 10 shows the relationship of the lengths "a" and "b" of the bird's beak. As shown in FIG. 10, the length "b" of the bird's beak which projects greatly increases when the width of the oxidation resistant mask layer 31, that is, the width of the original active region becomes 1 μm or less.

FIG. 11 is a plan view similar to FIG. 2A. In this SRAM, the area of the region where the active region and the first polysilicon layer make contact, that is, the areas of regions 34 and 35 shown in FIG. 11 are narrowed by the bird's beak, and a satisfactory contact can no longer be obtained at these regions 34 and 35.

Most of the problems described above can be eliminated by a split word line type SRAM which was not popular due to the various disadvantages thereof. Hence, a description will now be given of the problems of the split word line type SRAM.

FIG. 12 is a plan view showing an essential part of a conventional split word line type SRAM. This split word line type SRAM includes an active region 41, a word line 42 which is made of a first polysilicon layer, a gate electrode 43 which is also made of the first polysilicon layer and forms the gate electrode of a driver transistor, a buried contact region 44, a contact hole 45, ground lines 46 and 47, and bit lines 48 and 49 made of a metal. WL is shown in brackets to indicate the word lines 42, and BL and /BL are shown in brackets to respectively indicate the bit lines 48 and 49.

According to this split word line type SRAM, two word lines WL are provided with respect to one memory cell as indicated by the word lines 42. This is the reason this SRAM is called the split word line type. The symmetrical characteristic of the memory cells is satisfactory and only two contact holes are necessary per memory cell to achieve the contact between the first polysilicon layer and the active region 41. However, there are problems in that the area of the memory cell is large compared to the three kinds of SRAMs described above and three kinds of metal interconnections are required per memory cell. For these reasons, the split word line type SRAM has not become popular, and no further developments were made to improve its integration density.

SUMMARY OF THE INVENTION

Accordingly, it is a general object of the present invention to provide a novel and useful thin film transistor (TFT) load type static random access memory (SRAM) in which the problems described above are eliminated.

Another and more specific object of the present invention is to provide a semiconductor memory device comprising a semiconductor substrate, a memory cell formed on the semiconductor substrate and including first and second transfer transistors, first and second driver transistors and first and second thin film transistor loads, and first and second word lines extending generally parallel to each other along a predetermined direction and respectively coupled to gate electrodes of the first and second transfer transistors, where each of the first and second thin film transistor loads include first and second impurity regions which sandwich a channel region formed by a semiconductor layer provided on the semiconductor substrate, and a gate electrode formed by confronting conductor layers and isolated from the channel region, the first driver transistor includes a drain which is coupled to one of the impurity regions of the first thin film transistor load and to a gate of the second driver transistor via a first connection region, the second driver transistor includes a drain which is coupled to one of the impurity regions of the second thin film transistor load and to a gate of the first driver transistor via a second connection region, and the first and second connection regions are independently provided and have the same structure. According to the semiconductor memory device of the present invention, the number of mask processes required for the production can be reduced by combining the advantageous features of the split word line type SRAM and the TFT load type SRAM, and the semiconductor memory device can be produced by relatively simple processes with a high production yield. In addition, a sufficient contact area can be guaranteed at the contact hole by eliminating the undesirable effects of the bird's beak and high immunity to α-ray can be accomplished.

Still another object of the present invention is to provide a semiconductor memory device of the type described above wherein each of the first and second contact regions are provided at parts where a plurality of conductor layers and a plurality of insulator layers are alternately stacked on the semiconductor substrate, each of the first and second contact regions include a contact hole which penetrates at least one of the stacked conductor layers and reaches the gate electrode of one of the first and second driver transistors, and an uppermost one of the stacked conductor layers makes contact with side surfaces of each conductor layer exposed within the contact hole and with the gate electrode of one of the first and second driver transistors exposed within the contact hole. According to the semiconductor memory device of the present invention, the number of mask processes can further be reduced.

A further object of the present invention is to provide a method of producing a semiconductor memory device which includes a memory cell made up of two transfer transistors, two driver transistors and two thin film transistor loads, and two word lines respectively coupled to gates of the two transfer transistors, where the method comprises the steps of (a) forming a gate insulator layer on a semiconductor substrate after forming a field insulator layer on a surface of the semiconductor substrate, (b) forming a gate electrode of the driver transistor by forming a first conductor layer and patterning the first conductor layer, (c) forming a first insulator layer after forming impurity regions in the semiconductor substrate using the field insulator layer and the first conductor layer as masks, (d) forming a second insulator layer after forming and patterning a second conductor layer, (e) forming a third insulator layer after forming and patterning a third conductor layer, (f) forming a contact hole which extends from a top surface of the third insulator layer and reaches a top surface of the first conductor layer, and (g) forming a fourth conductor layer which makes contact with the top surface of the first conductor layer and with side surfaces of the second and third conductor layers. According to the method of the present invention, the number of mask processes required for the production can be reduced by combining the advantageous features of the split word line type SRAM and the TFT 10ad type SRAM, and the semiconductor memory device can be produced by relatively simple processes with a high production yield. In addition, a sufficient contact area can be guaranteed at the second hole (contact hole) by eliminating the undesirable effects of the bird's beak and high immunity to α-ray can be accomplished.

Another object of the present invention is to provide a method of producing the semiconductor memory device of the type described above wherein the step (b) forms the first conductor layer which is made up of a first layer formed on the semiconductor substrate and a second layer formed on the first layer, where the second layer is made of a material selected from a group consisting of refractory metals and refractory metal silicides. According to the method of the present invention, it is possible to prevent damage to the gate electrode of the driver transistor and the semiconductor substrate when forming the second hole, and also prevent etching residue from remaining within the second hole. As a result, it is possible to produced semiconductor memory devices having uniform characteristics with a high production yield.

Other objects and further features of the present invention will be apparent from the following detailed description when read in conjunction with the accompanying drawings.

BRIEF DESCRIPTION OF THE DRAWINGS

FIGS. 1A through 1J are side views in cross section showing essential parts of a high resistance load type SRAM at essential stages of a conventional method of producing the high/resistance load type SRAM;

DESCRIPTION OF THE PREFERRED EMBODIMENTS

First, a description will be given of a first embodiment of a semiconductor memory device according to the present invention which is produced by a first embodiment of a method of producing the semiconductor memory device according to the present invention. FIGS. 13A through 13M are side views in cross section showing an essential part of the first embodiment of the semiconductor memory device according to the present invention at essential stages of the first embodiment of the method of producing the semiconductor memory device according to the present invention. FIGS. 14A through 14F are plan views of the semiconductor memory device at essential stages of the first embodiment of the method shown in FIGS. 13A through 13M. FIGS. 13A through 13M respectively are cross sections taken along a line which corresponds to a line X—X in the plan view of FIG. 14A. In this embodiment, the present invention is applied to the double gate TFT load type SRAM.

Figure 13A:
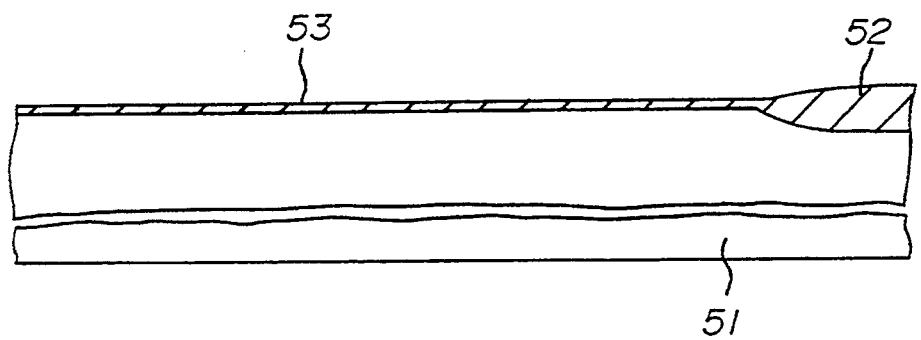
FIGS. 13A through 13M are side views in cross section showing an essential part of a first embodiment of a semiconductor memory device according to the present invention at essential stages of a first embodiment of a method of producing the semiconductor memory device according to the present invention.

In FIG. 13A, a silicon dioxide ($SiO_2$) layer which covers an active region of a silicon (Si) semiconductor substrate 51 is used as a pad layer, for example, and a silicon nitride ($Si_3N_4$) layer which is formed on the $SiO_2$ layer is used as an oxidation resistant mask layer when carrying out a selective thermal oxidation so as to form a field insulator layer 52. This field insulator layer 52 is made of $SiO_2$ and has a thickness of 4000 Å, for example.

Then, the $Si_3N_4$ layer and the $SiO_2$ layer which are used when carrying out the selective thermal oxidation are removed to expose the active region of the Si semiconductor substrate 51. Thereafter, a thermal oxidation is carried out to form a gate insulator layer 53 which is made of $SiO_2$ and has a thickness of 100 Å, for example.

Figure 13B:
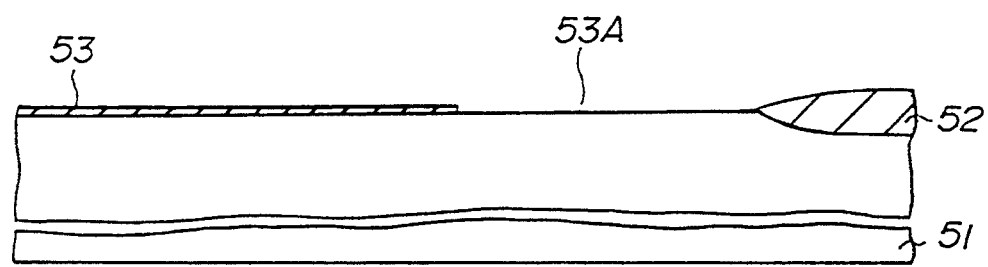

In FIG. 13B, a resist process of the photolithography technique and a wet etching using hydrofluoric acid as the etchant are carried out to selectively etch the gate insulator layer 53 and to form a contact hole 53A which is also used when diffusing impurities.

Figure 13C:
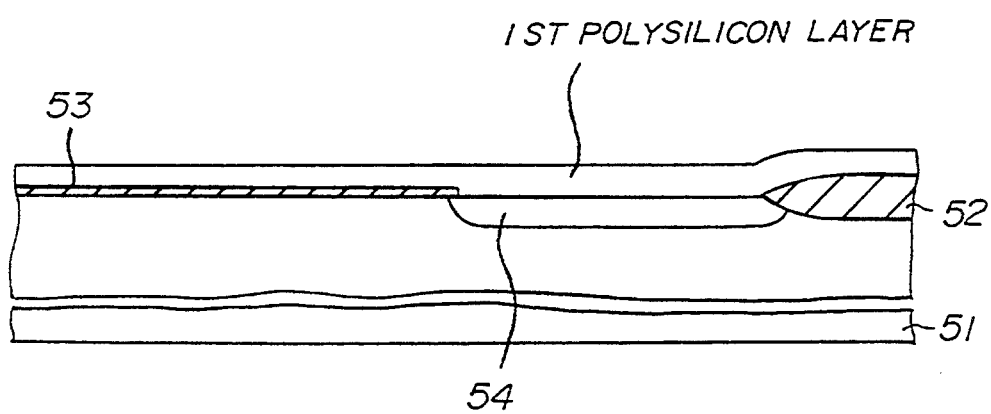

In FIG. 13C, a CVD is carried out to form a first polysilicon layer having a thickness of 1000 Å, for example.

Then, a vapor phase diffusion is carried out introduce P with an impurity concentration of $1 \times 10^{20}$ cm$^{-3}$ and to form an n+-type impurity region 54.

Figure 13D:
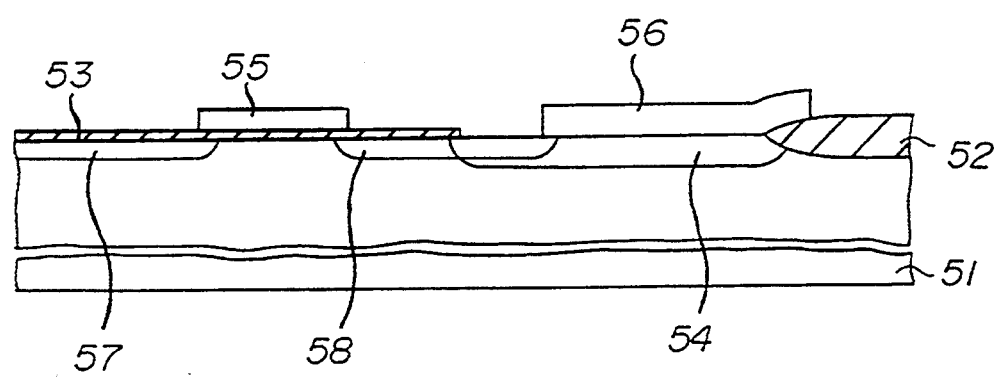
Figure 14A:
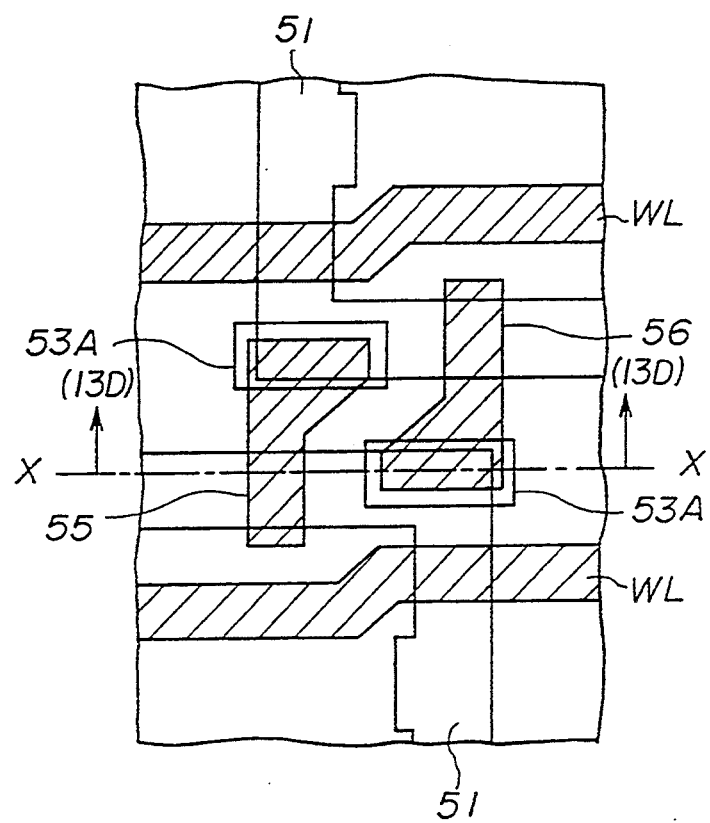
FIGS. 14A through 14F are plan views of the semiconductor memory device at essential stages of the first embodiment of the method shown in FIGS. 13A through 13M.

In FIGS. 13D and 14A, a resist process of the photolithography technique and a RIE using CCl$_4$/O$_2$ as the etching gas are carried out to pattern the first polysilicon layer and to form gate electrodes 55 and 56 and a word line WL.

By carrying out an ion implantation, As ions are injected with a dosage of $1 \times 10^{15}$ cm$^{-2}$ and an acceleration energy of 30 keV to form an n+-type source region 57 and an n+-type drain region 58. The source and drain of the transistor may of course have a lightly doped drain (LDD) structure.

Figure 13E:
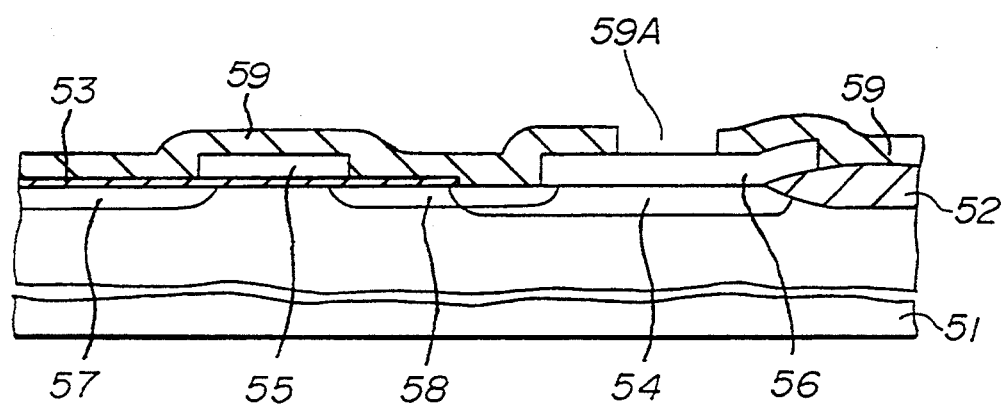
Figure 14B:
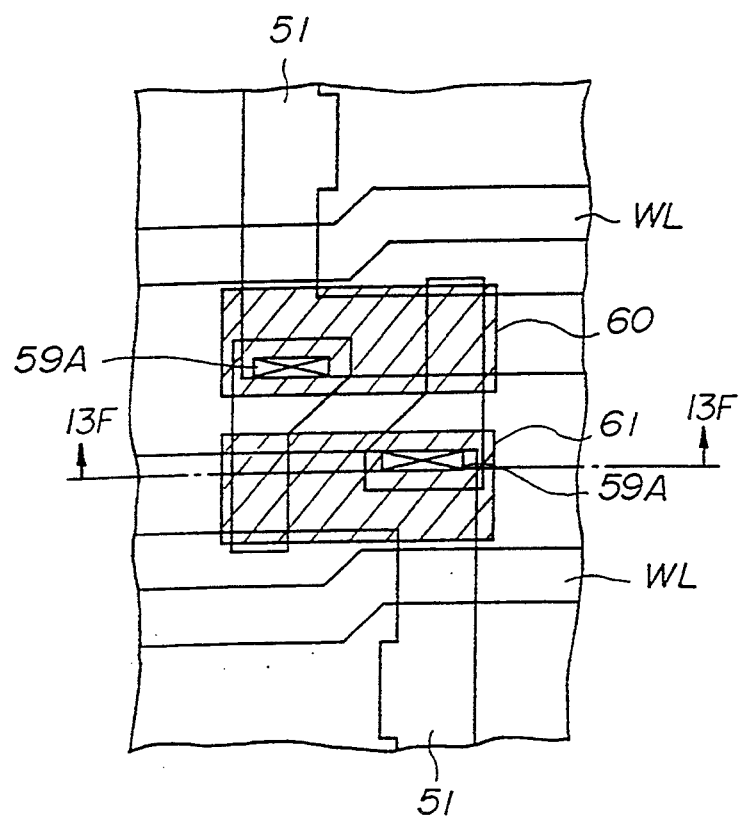

In FIGS. 13E and 14B, a CVD is carried out to form an insulator layer 59 which is made of SiO$_2$ and has a thickness of 1000 Å, for example.

A RIE using CHF$_3$ as the etching gas is carried out to selectively etch the insulator layer 59 and to form a contact hole 59A which is used to achieve contact between the first polysilicon layer and a second polysilicon layer.

Figure 13F:
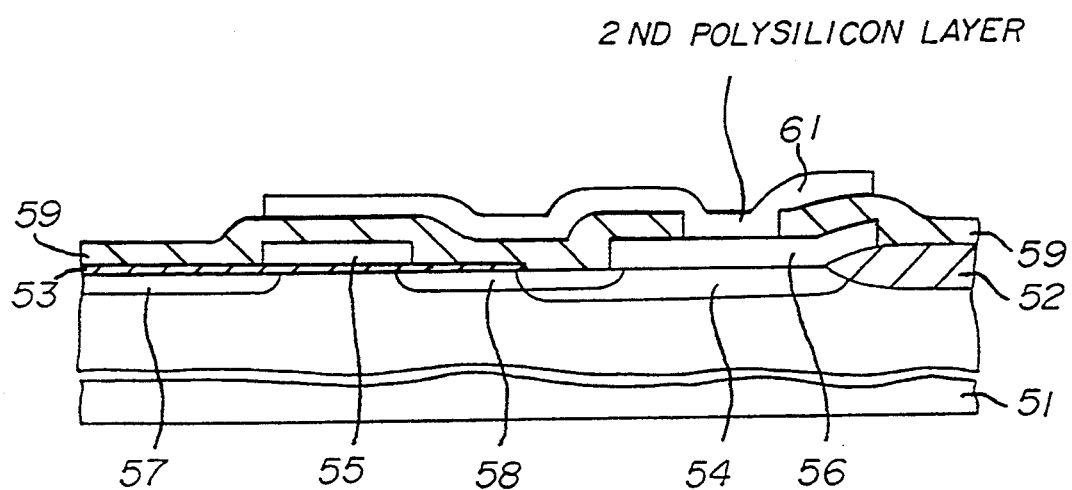

In FIGS. 13F and 14B, a CVD is carried out to form the second polysilicon layer having a thickness of 1000 Å, for example.

By carrying out a vapor phase diffusion, P is introduced in the second polysilicon layer with an impurity concentration of $1 \times 10^{20}$ cm$^{-3}$, for example.

A resist process of the photolithography technique and a RIE using CCl$_4$/O$_2$ as the etching gas are carried out to pattern the second polysilicon layer and to form lower gate electrodes 60 and 61 of the TFTs. Of course, these lower gate electrodes 60 and 61 make contact with the gate electrodes 55 and 56 of the driver transistors which are formed by the first polysilicon layer.

Figure 13G:
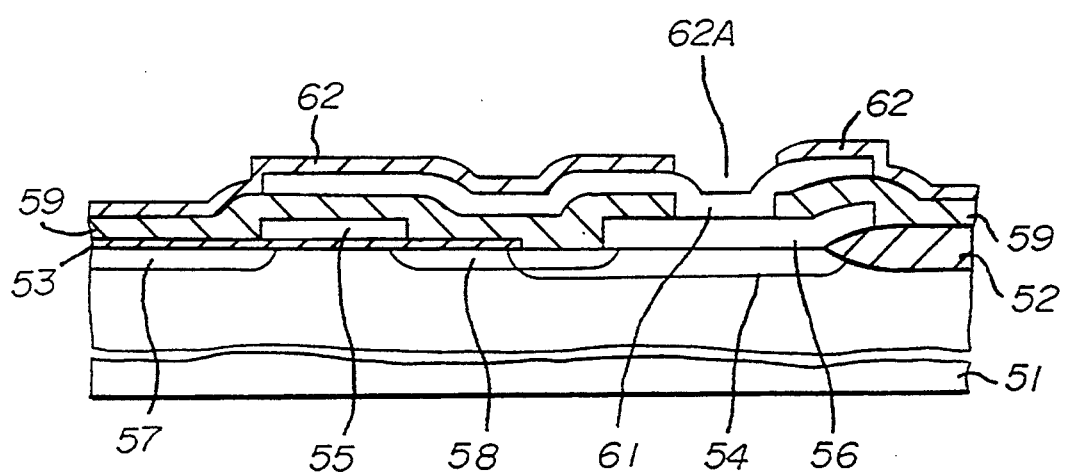

In FIG. 13G, a CVD is carried out to form an insulator layer 62 which is made of SiO$_2$ and has a thickness of 200 Å.

A resist process of the photolithography technique and a RIE using CHF$_4$/He as the etching gas are carried out to selectively etch the insulator layer 62 and to form a contact hole 62A for achieving contact between the second polysilicon layer and a third polysilicon layer.

Figure 13H:
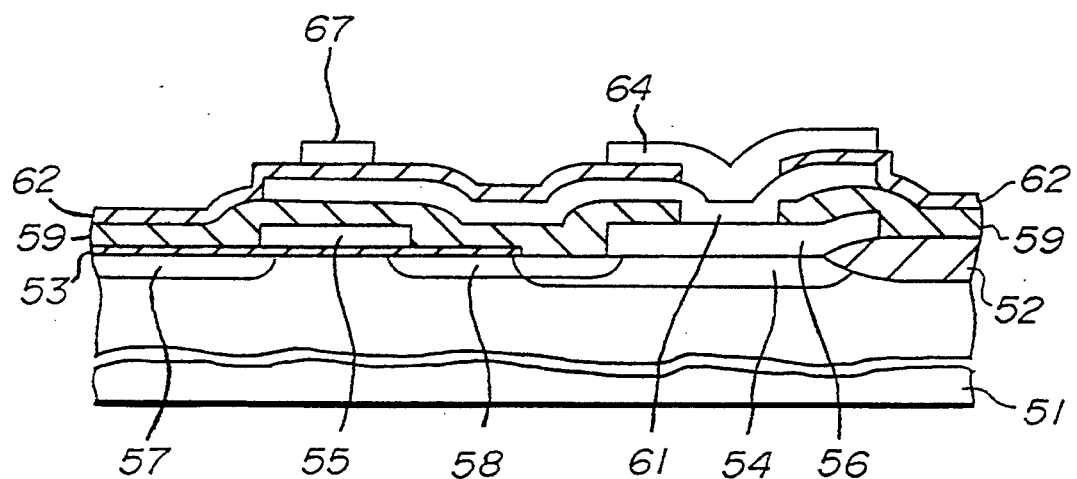
Figure 14C:
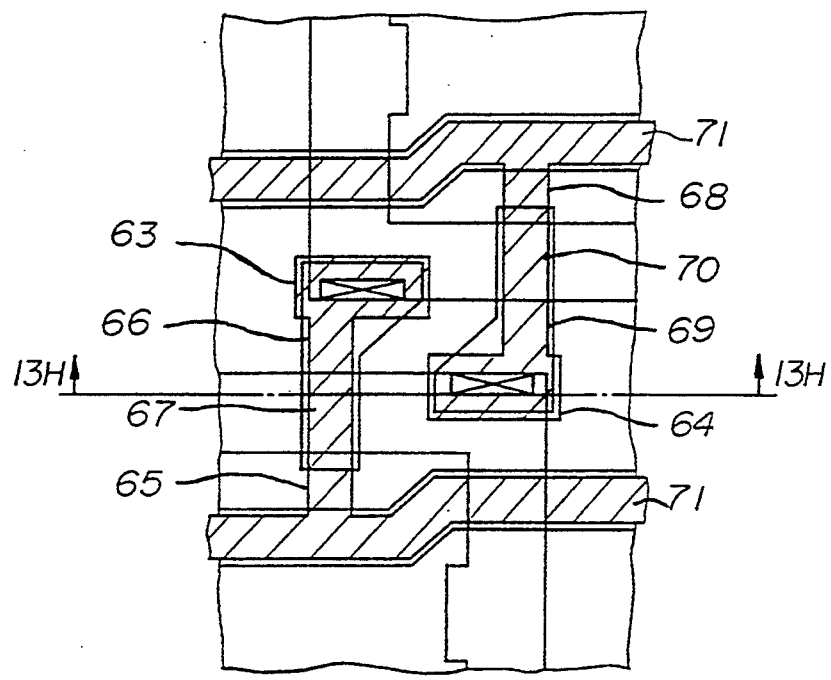

In FIGS. 13H and 14C, a CVD is carried out to form the third polysilicon layer which has a thickness of 500 Å, for example.

A resist process of the photolithography technique and an ion implantation are carried out to inject B with a dosage of $1 \times 10^{14}$ cm$^{-2}$ and an acceleration energy of 5 keV into parts of the third polysilicon layer where source and drain regions of the TFTs and a Vcc supply line are to be formed.

A resist process of the photolithography technique and a RIE using CCl$_4$/O$_2$ are carried out to pattern the third polysilicon layer and to form contact parts 63 and 64, drain, source and channel regions 65, 66 and 67 of one TFT, drain, source and channel regions 68, 69 and 70 of the other TFT, and a Vcc supply line 71.

Figure 13I:
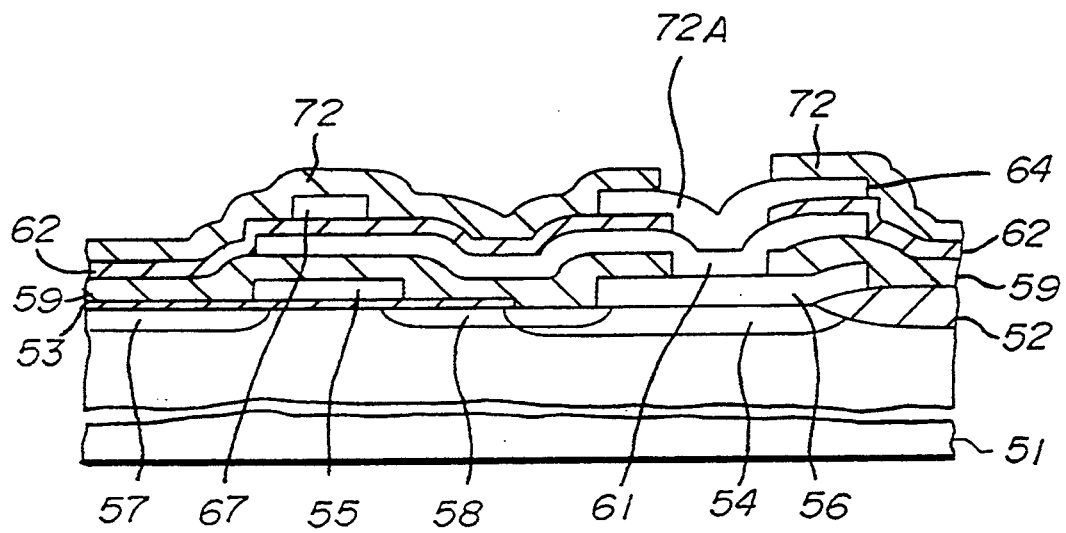

In FIG. 13I, a CVD is carried out to form an insulator layer 72 which is made of SiO$_2$ and has a thickness of 500 Å.

A resist process of the photolithography technique and a RIE using CHF$_3$/He as the etching gas are carried out to selectively etch the insulator layer 72 and to form a contact hole 72A for achieving contact between the third polysilicon layer and a fourth polysilicon layer.

Figure 13J:
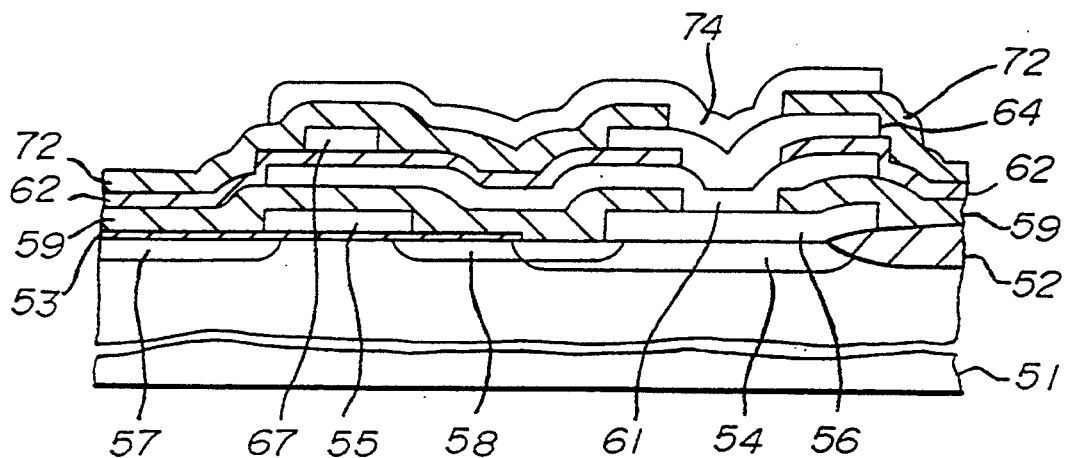
Figure 14D:
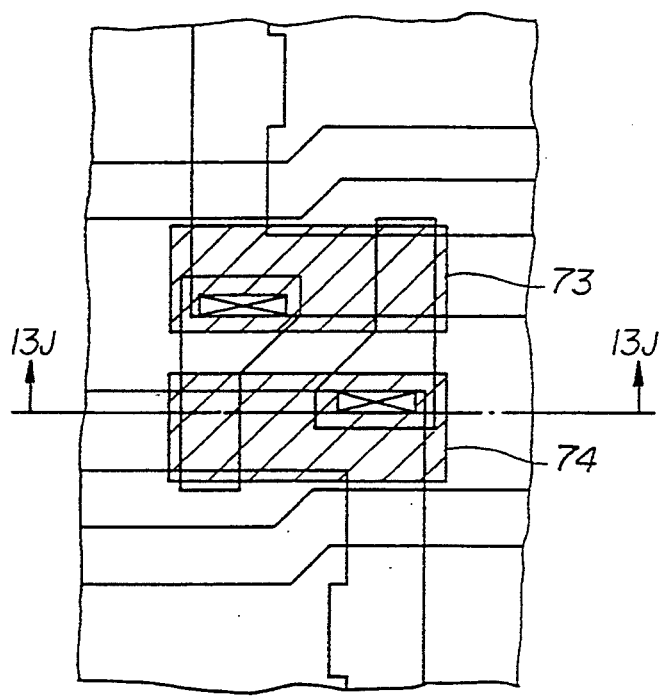

In FIGS. 13J and 14D, a CVD is carried out to form the fourth polysilicon layer which has a thickness of 1000 Å, for example.

By carrying out a vapor phase diffusion, P is introduced into the fourth polysilicon layer with an impurity concentration of $1 \times 10^{20}$ cm$^{-3}$ for example.

A resist process of the photolithography technique and a RIE using CCl$_4$/O$_2$ as the etching gas are carried out to pattern the fourth polysilicon layer and to form upper gate electrodes 73 and 74 of the TFTs. Of course, these upper gate electrodes 73 and 74 make contact with the gate electrodes 55 and 56 of the driver transistors which are substantially formed by the first polysilicon layer.

Figure 13K:
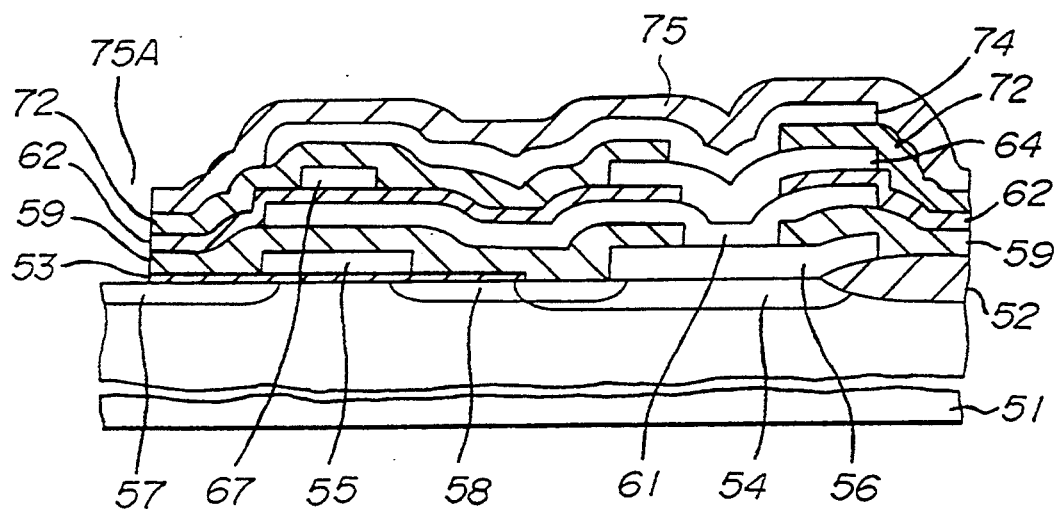

In FIG. 13K, a CVD is carried out to form an insulator layer 75 which is made of SiO$_2$ and has a thickness of 1000 Å, for example.

A resist process of the photolithography technique and a RIE using CHF$_3$/He as the etching gas are carried out to selectively etch the insulator layers 75, 72, 62, 59 and 53 which are made of SiO$_2$ and to form a contact hole 75A for achieving contact between the source region and a fifth polysilicon layer. Only the source region 57 is shown in FIG. 13K.

Figure 13L:
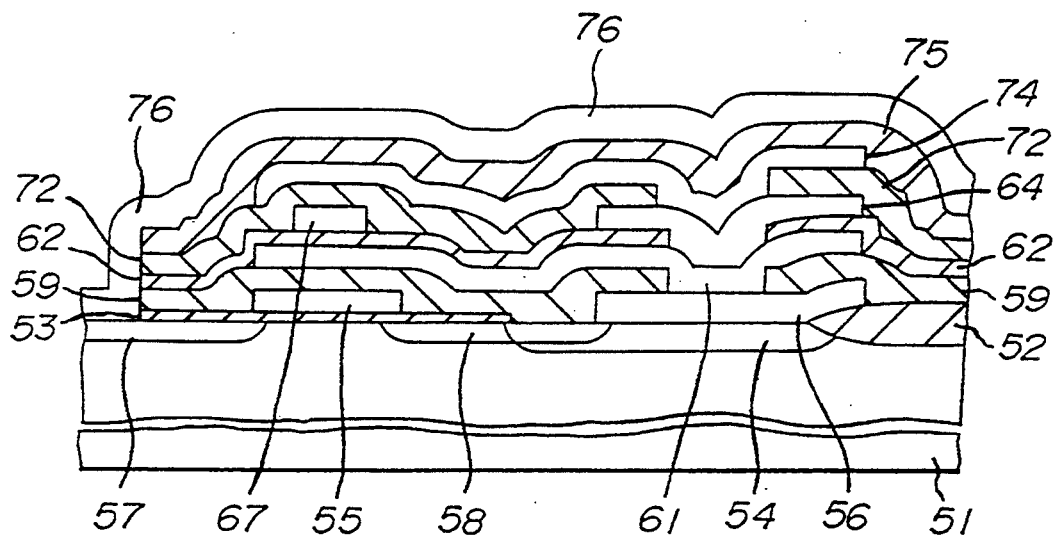
Figure 14E:
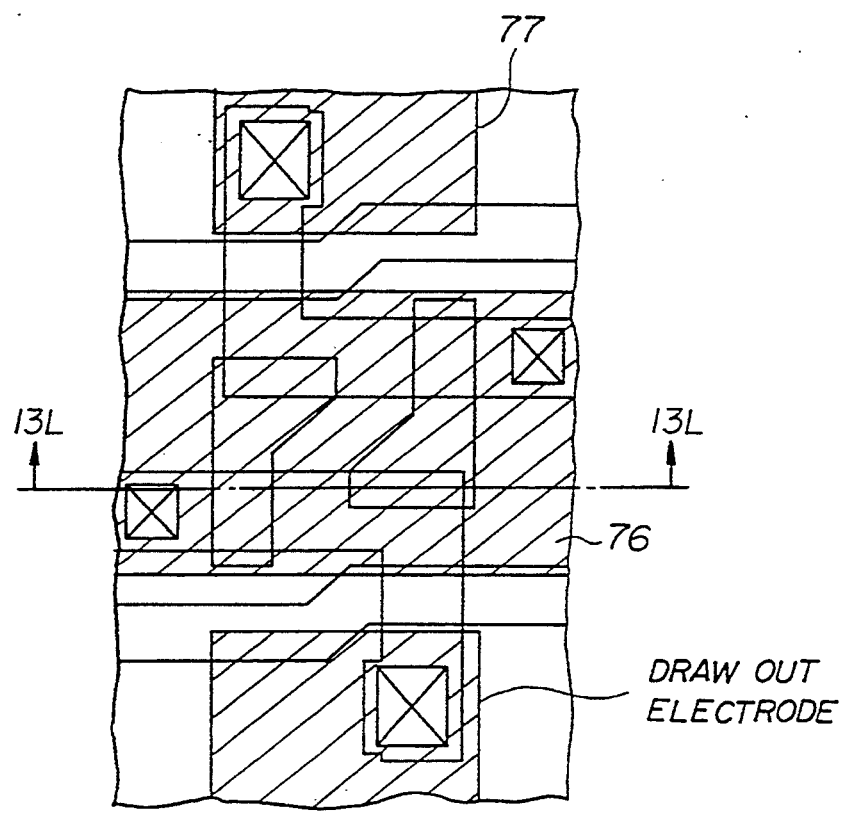

In FIGS. 13L and 14E, a CVD is carried out to form the fifth polysilicon layer which has a thickness of 1000 Å, for example.

By carrying out a vapor phase diffusion, P is introduced into the fifth polysilicon layer with an impurity concentration of $1 \times 10^{20}$ cm$^{-3}$ for example.

A resist process of the photolithography technique and a RIE using CCl$_4$/O$_2$ as the etching gas are carried out to pattern the fifth polysilicon layer and to form a ground line 76 and a draw out electrode 77.

Figure 13M:
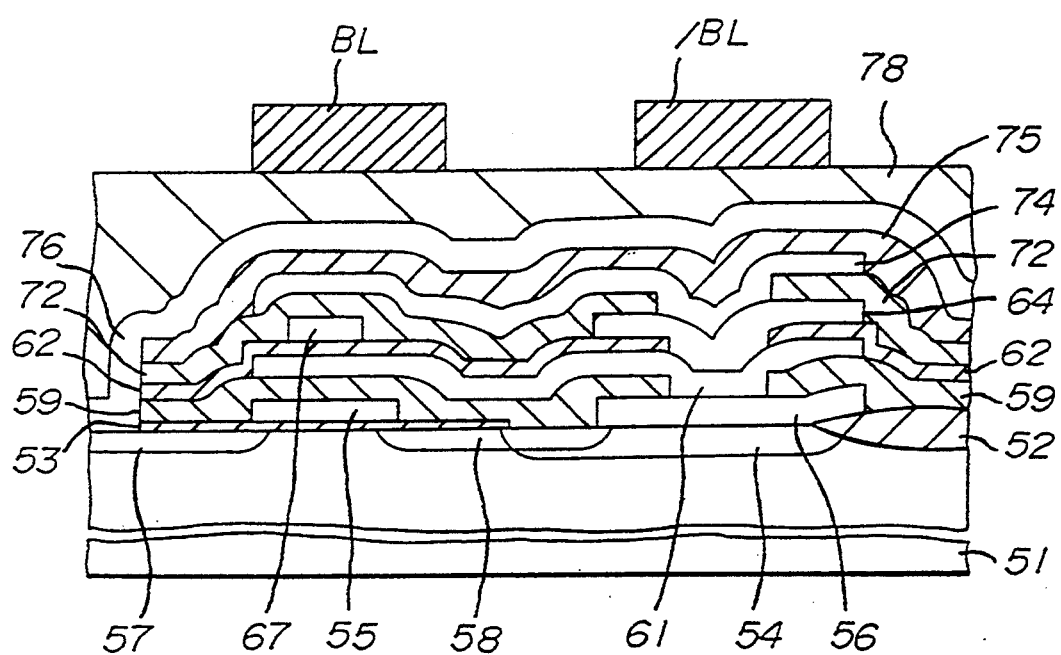
Figure 14F:
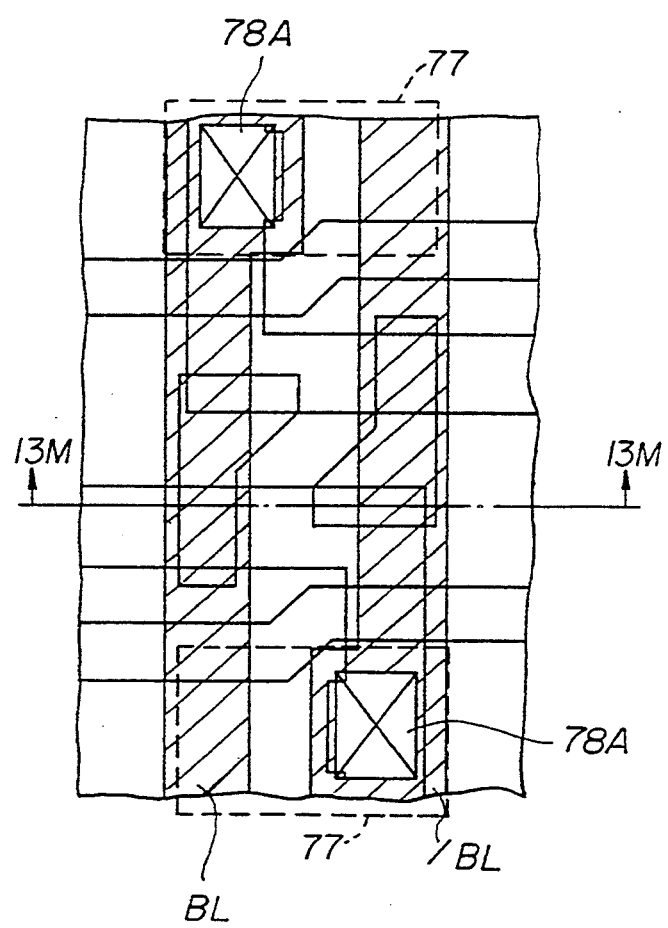

In FIGS. 13M and 14F, a CVD is carried out to form an insulator layer which is made of SiO$_2$ and has a thickness of 500 Å, for example, and an insulator layer which is made of borophosphosilicate glass (BPSG) and has a thickness of 3000 Å, for example. In FIG. 13M, these two insulator layers are shown as one insulator layer 78.

A thermal process is then carried out to reflow and planarize the insulator layer 78.

Then, a resist process of the photolithography technique and a RIE using CHF$_3$/He as the etching gas are carried out to selectively etch the insulator layer 78 and the like and to form a bit line contact hole 78A.

A sputtering is carried out to form an Al layer having a thickness of 1 μm, for example, and this Al layer is patterned by the normal photolithography technique to form bit lines BL and/BL.

Figure 7A:
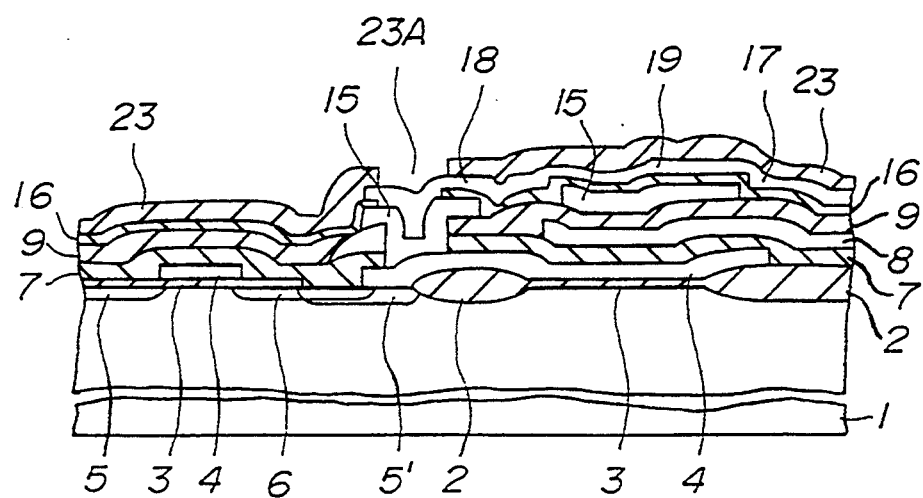
FIGS. 7A through 7C are side views in cross section showing essential parts of a double gate structure TFT load type SRAM at essential stages of a conventional method of producing the double gate structure TFT load type SRAM.
Figure 7B:
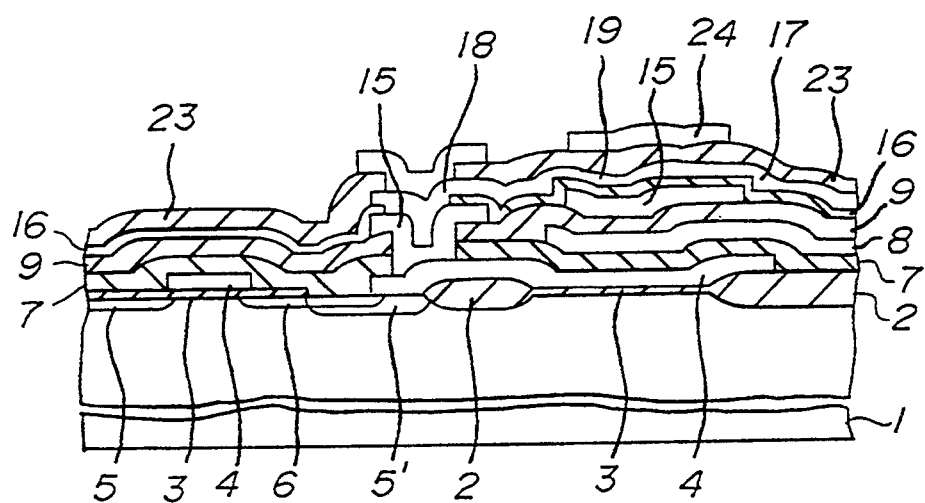
Figure 7C:
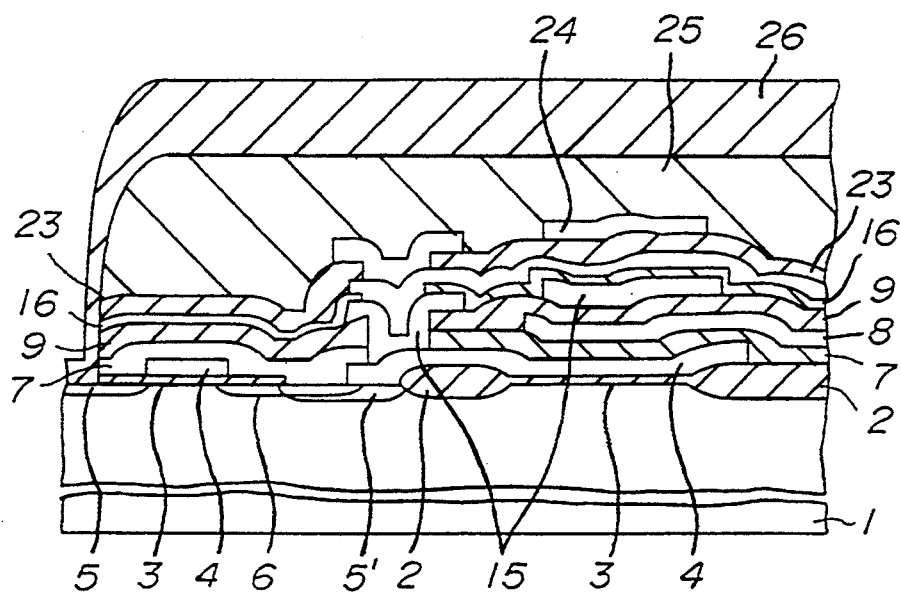
Figure 8:
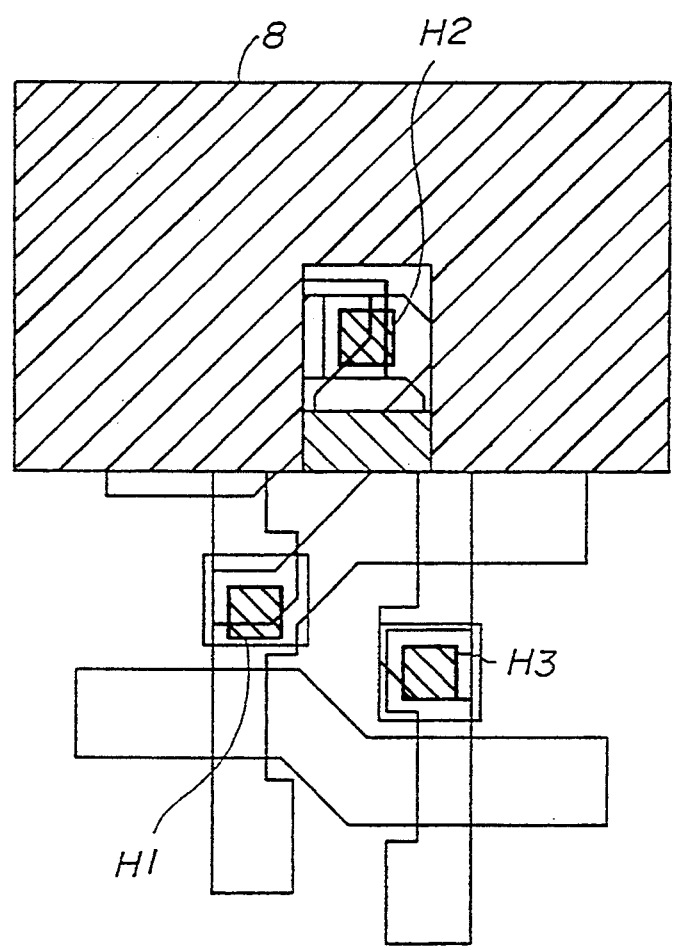
FIG. 8 is a plan view showing an essential part of the conventional TFT load type SRAM at an essential stage of the production process thereof.
Figure 9:
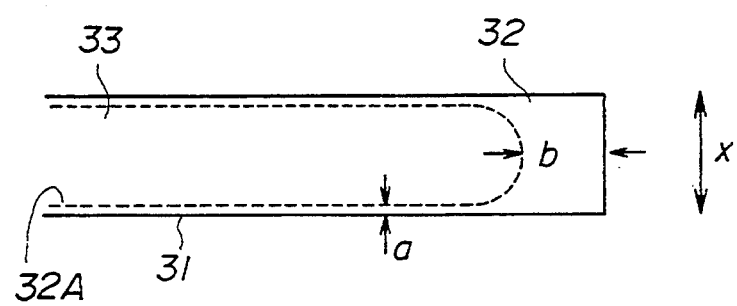
FIG. 9 is a plan view showing an essential part of a semiconductor device at an essential stage of the production process thereof, for explaining the formation of a field insulator layer which surrounds an active region using a selective thermal oxidation.
Figure 10:
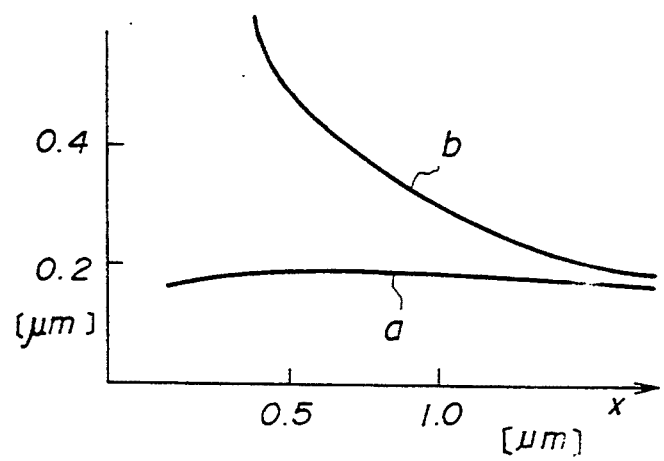
FIG. 10 shows the relationship of the lengths "a" and "b" of the bird's beak.
Figure 11:
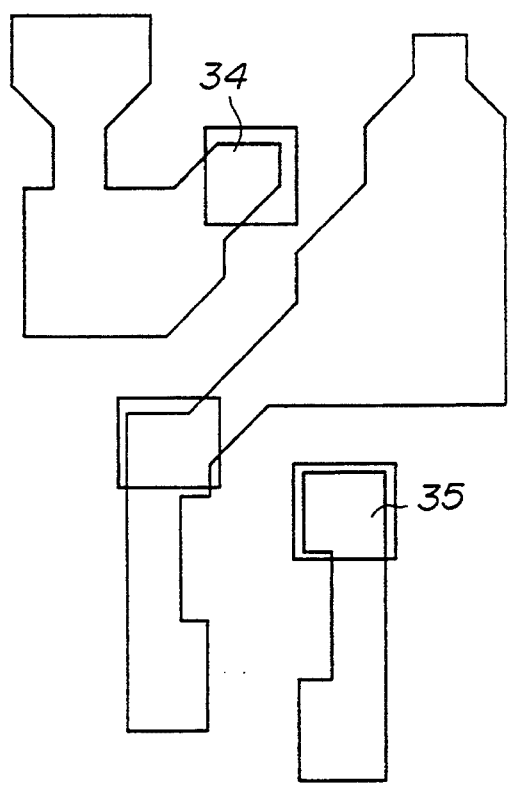
Figure 12:
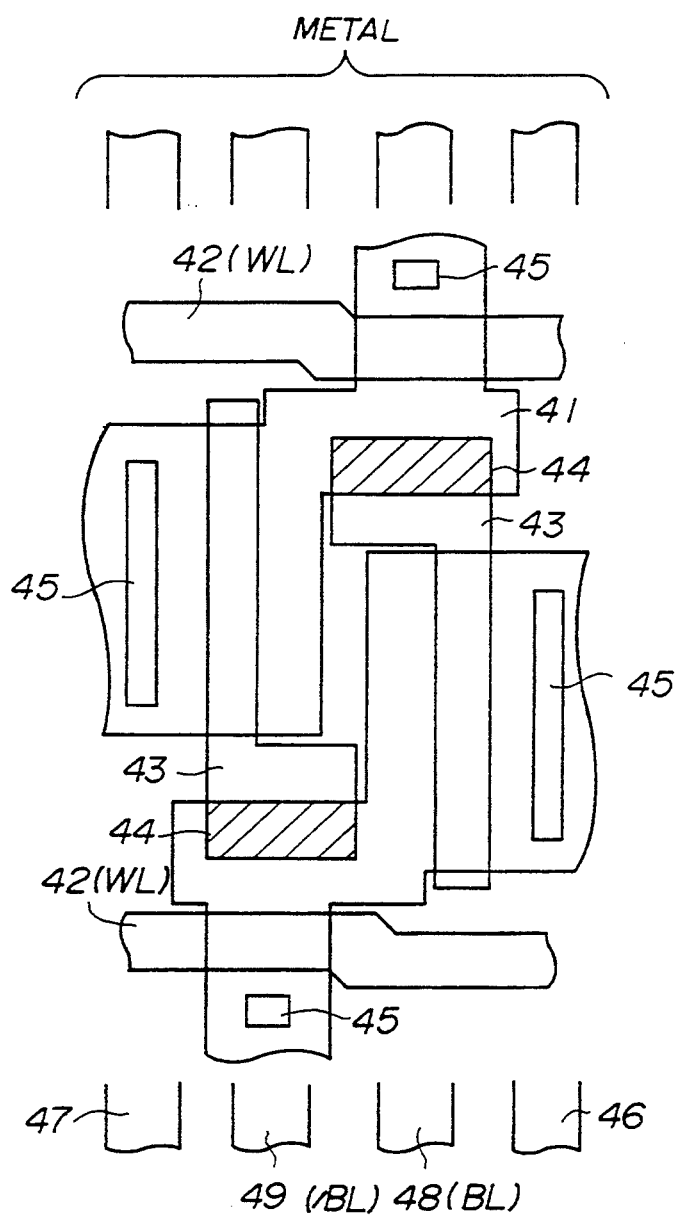
FIG. 12 is a plan view showing an essential part of a conventional split word/line type SRAM.

According to this first embodiment described in conjunction with FIGS. 13 and 14, the processes themselves are basically similar to those of the prior art described with reference to FIGS. 7A through 7C. But while the prior art forms the ground line from the second polysilicon layer, this embodiment greatly differs therefrom in that this embodiment forms the ground line 76 from the fifth polysilicon layer.

In addition, as may be readily seen from FIG. 13M, the ground line 76 and the upper gate electrode 74 of the TFT form a capacitor. Accordingly, if this capacitor structure is positively utilized, it is possible to reduce the soft error caused by radiant rays such as the α-ray. For example, the capacitance can be increased by simple means such as reducing the thickness of the insulator layer 75 between the fourth and fifth polysilicon layers, and increasing the thickness of the fourth polysilicon layer and also using the side surfaces as a part of the capacitor.

Next, a description will be given of a second embodiment of the semiconductor memory device according to the present invention which is produced by a second embodiment of the method of producing the semiconductor memory device according to the present invention. FIGS. 15A through 15I are side views in cross section showing an essential part of the second embodiment of the semiconductor memory device according to the present invention at essential stages of the second embodiment of the method of producing the semiconductor memory device according to the present invention. In this embodiment, the present invention is applied to the double gate TFT load type SRAM.

In FIGS. 15A through 15I, those parts which are the same as those corresponding parts in FIGS. 13 and 14 are designated by the same reference numerals.

In this embodiment of the method, the processes are the same as those of the first embodiment of the method up to the processes shown in FIGS. 13A through 13D, that is, until the n+-type source region 57 and the n+-type drain region 58 are formed. Hence, a description will only be given of the processes carried out thereafter.

Figure 15A:
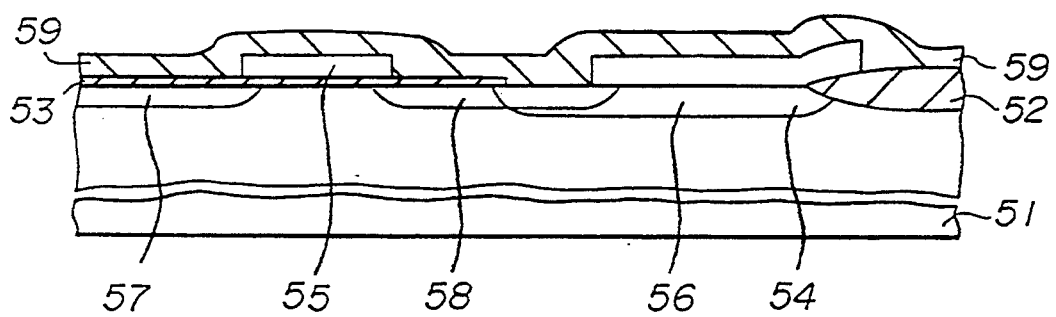
FIGS. 15A through 15I are side views in cross section showing an essential part of a second embodiment of the semiconductor memory device according to the present invention at essential stages of a second embodiment of the method of producing the semiconductor memory device according to the present invention.

In FIG. 15A, a CVD is carried out to form an insulator layer 59 which is made of $SiO_2$ and has a thickness of 1000 Å, for example.

Figure 15B:
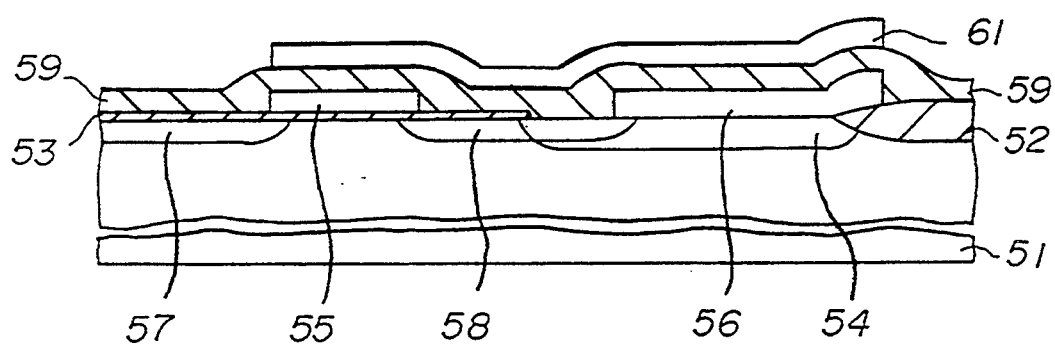

In FIG. 15B, a CVD is carried out to form a second polysilicon layer having a thickness of 1000 Å, for example.

By carrying out a vapor phase diffusion, P is introduced into the second polysilicon layer with an impurity concentration of $1 \times 10^{20}$ cm$^{-3}$, for example.

A resist process of the photolithography technique and a RIE using $CCl_4/O_2$ as the etching gas are carried out to pattern the second polysilicon layer and to form a lower gate electrode 61 or the TFT and the like.

Figure 15C:
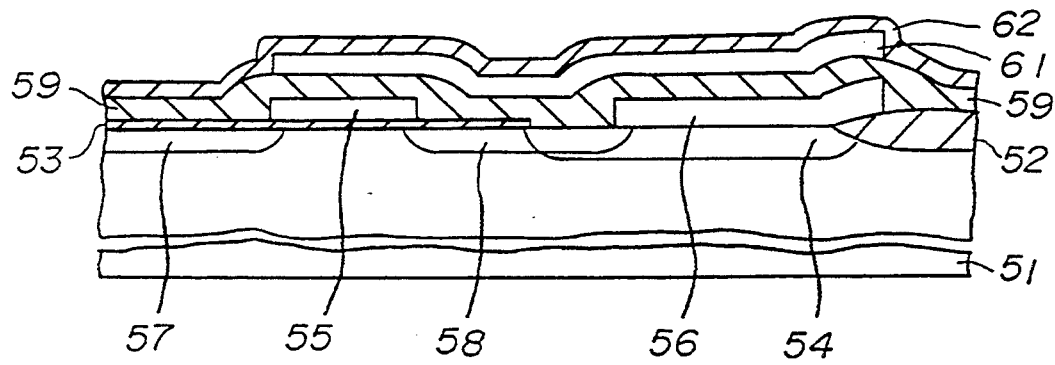

In FIG. 15C, a CVD is carried out to form an insulator layer 62 which is made of $SiO_2$ and has a thickness of 200 Å, for example.

Figure 15D:
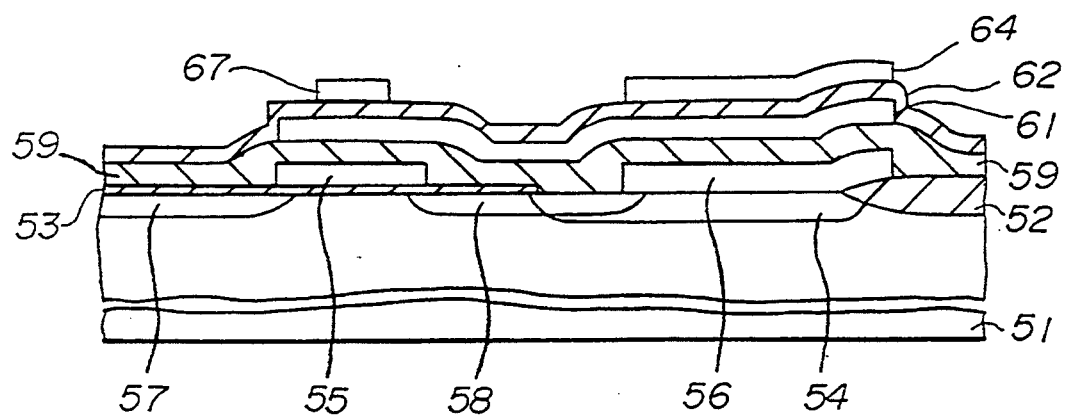

In FIG. 15D, a CVD is carried out to form a third polysilicon layer which has a thickness of 500 Å, for example.

A resist process of the photolithography technique and an ion implantation are carried out to inject B into parts of the third polysilicon layer where source and drain regions of TFTs and a Vcc supply line are formed with a dosage of $1 \times 10^{14}$ cm$^{-2}$ and an acceleration energy of 10 keV.

A resist process of the photolithography technique and a RIE using $CCl_4/O_2$ are carried out to pattern the third polysilicon layer and to form a contact part, the drain, source and channel regions of each TFT and the Vcc supply line. FIG. 15D shows a contact part 64 and a channel region 67, but the entire pattern formed in this process can be more easily understood by referring to FIG. 14C.

Figure 15E:
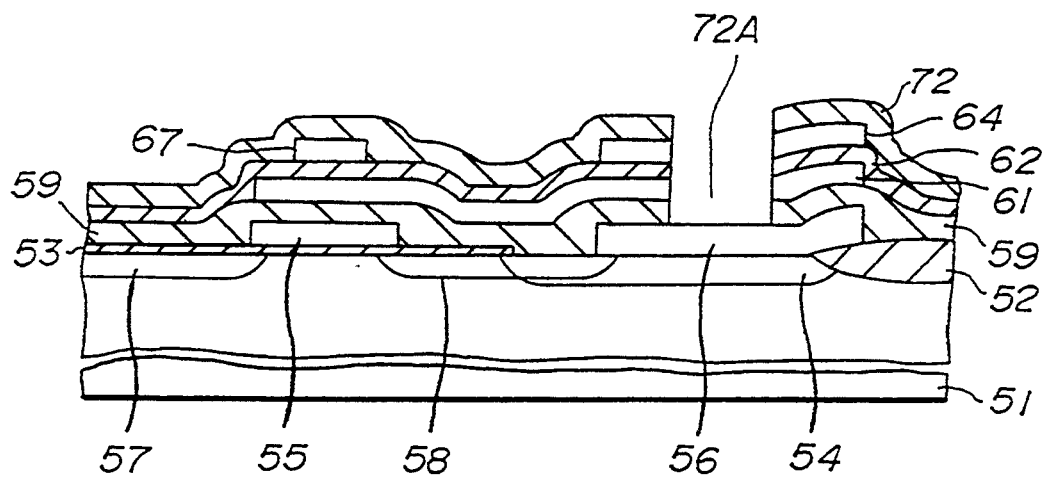

In FIG. 15E, a CVD is carried out to form an insulator layer 72 which is made of $SiO_2$ and has a thickness of 1000 Å, for example.

A resist process of the photolithography technique and RIEs using $CHF_3/He$ and $CCl_4/O_2$ as the etching gases are carried out to selectively etch the insulator layer 72, the third polysilicon layer, the insulator layer 62, the second polysilicon layer and the insulator layer 59. The $CHF_3/He$ gas is used for the selective etching of $SiO_2$, while the $CCl_4/O_2$ gas is used for the selective etching of the polysilicon. After carrying out the selectively etching, a mutually connecting contact hole 72A is formed. This mutually connecting contact hole 72A extends from the top surface of the insulator layer 72 to the gate electrode of the driver transistor which is formed by the first polysilicon layer. This process forms the essential part of this embodiment.

Figure 15F:
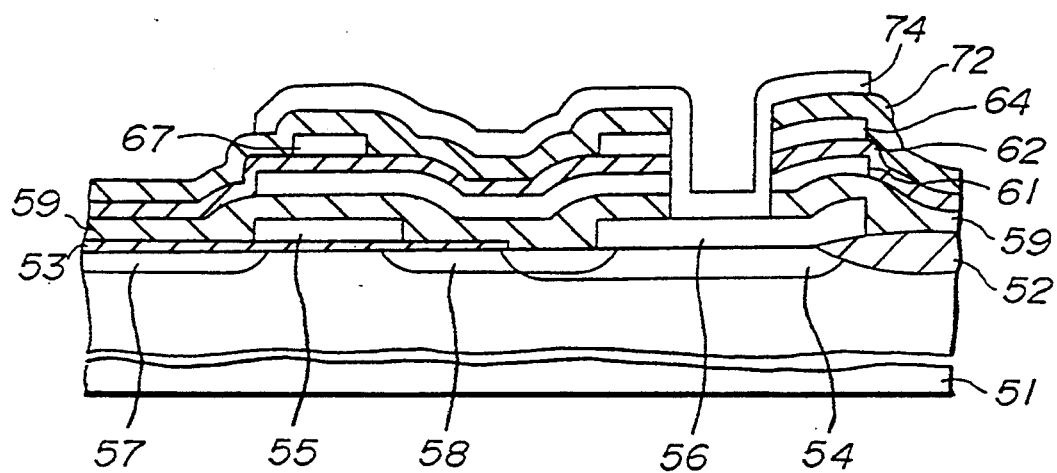

In FIG. 15F, a CVD is carried out to form a fourth polysilicon layer having a thickness of 1000 Å, for example.

By carrying out a vapor phase diffusion, P is introduced into the fourth polysilicon layer with an impurity concentration of $1 \times 10^{20}$ cm$^{-3}$, for example.

A resist process of the photolithography technique and a RIE using $CCl_4/O_2$ as the etching gas are carried out to pattern the fourth polysilicon layer and to form an upper gate 74 and the like of the TFT. As shown in FIG. 15F, the upper gate electrode 74 and the like which are formed by this process make direct contact with the gate electrode 56 and the like of the driver transistor which are formed by the first polysilicon layer. Particularly, the upper gate electrode 74 simultaneously makes contact with the side surfaces of the contact part 64, the lower gate electrode 61 and the top surface of the gate electrode 56.

Figure 15G:
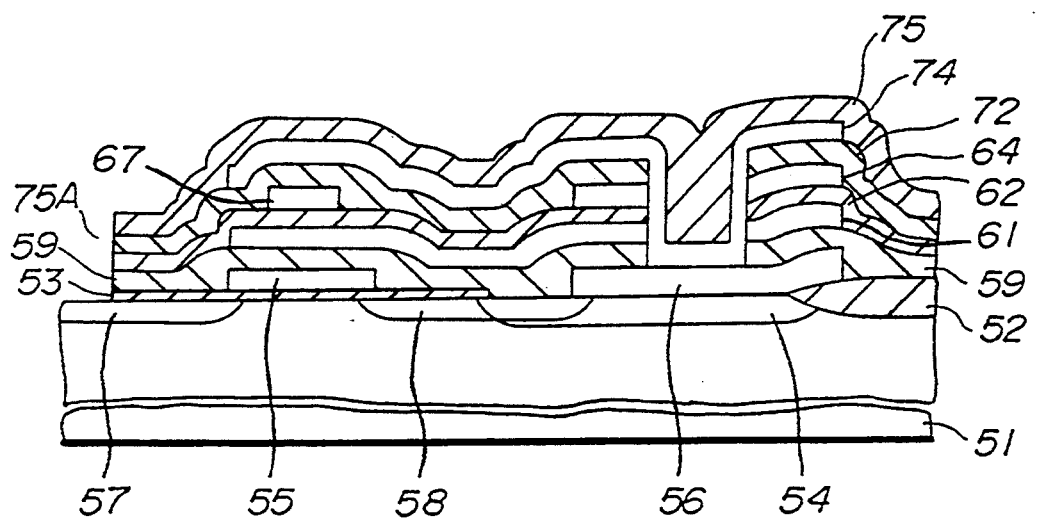

In FIG. 15G, a CVD is carried out to form an insulator layer 75 which is made of $SiO_2$ and has a thickness of 1000 Å, for example.

A resist process of the photolithography technique and a RIE using $CHF_3/He$ as the etching gas are carried out to selectively etch the insulator layers 75, 72, 62, 59 and 53 which are made of $SiO_2$ and to form a contact hole 75A for achieving contact between the source region and a fifth polysilicon layer. Only the source region 57 is shown in FIG. 15G.

Figure 15H:
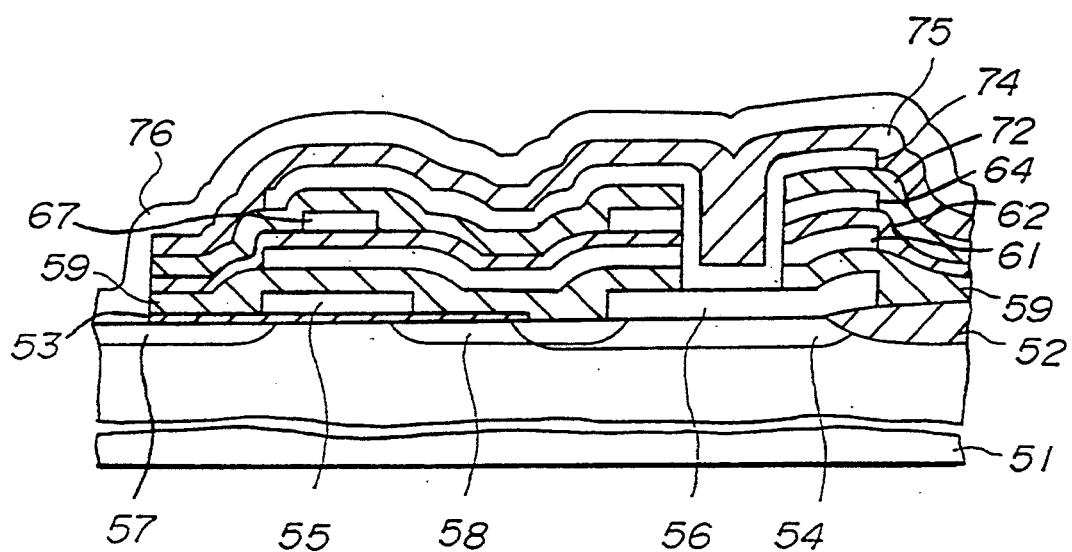

In FIG. 15H, a CVD is carried out to form the fifth polysilicon layer which has a thickness of 1000 Å, for example.

By carrying out a vapor phase diffusion, P is introduced into the fifth polysilicon layer with an impurity concentration of $1 \times 10^{20}$ cm$^{-3}$.

A resist process of the photolithography technique and a RIE using $CCl_4/O_2$ as the etching gas are carried out to pattern the fifth polysilicon layer and to form a ground line 76 and the like.

Figure 15I:
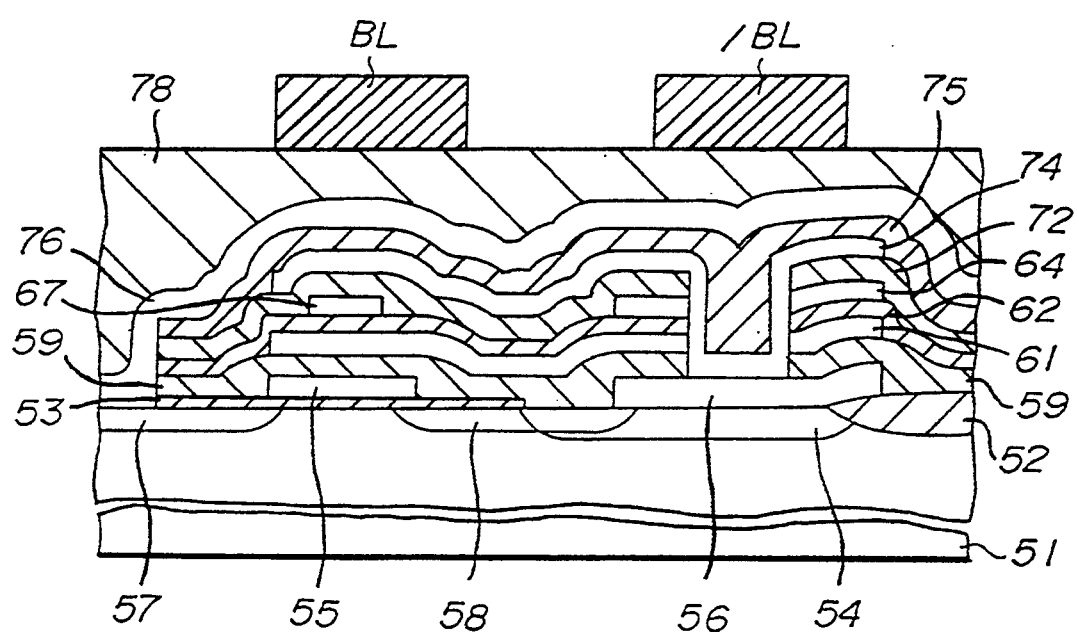

In FIG. 15I a CVD is carried out to form an insulator layer which is made of $SiO_2$ and has a thickness of 500 Å, for example, and an insulator layer which is made of PSG and has a thickness of 3000 Å, for example. These two insulator layers are shown as one insulator layer 78 in FIG. 15I.

Then, a thermal process is carried out to reflow and planarize the insulator layer 78.

A resist process of the photolithography technique and a RIE using $CHF_3/He$ as the etching gas are carried out to selectively etch the insulator layer 78 and the like and to form a bit line contact hole 78A.

An Al layer having a thickness of 1 μm, for example, is formed by a sputtering, and this Al layer is patterned using the normal photolithography technique to form bit lines BL and/BL.

In this second embodiment described with reference to FIGS. 15A through 15I, the mutually connecting contact hole 72A is formed by one process as shown in FIG. 15E. For this reason, it is possible to reduce the number of mask processes by two compared to the first embodiment. This becomes possible because there is only one kind of contact hole.

On the other hand, according to the prior art described with reference to FIGS. 4 and 5, for example, there are different kinds of contact holes and the etching must thus be controlled with a high accuracy.

Figure 16:
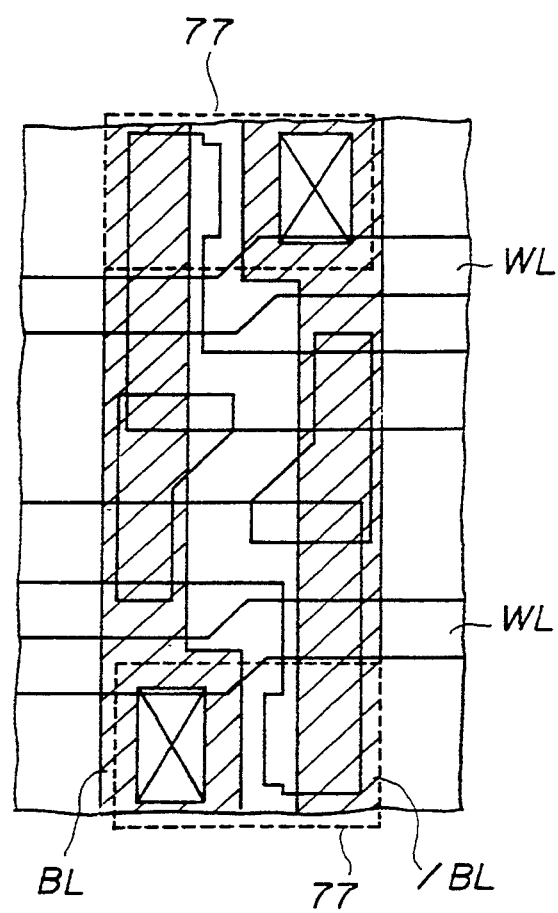
FIG. 16 is a plan view of a third embodiment of the semiconductor memory device according to the present invention at an essential stage of a third embodiment of the method of producing the semiconductor memory device according to the present invention.

Next, a description will be given of a third embodiment of the semiconductor memory device according to the present invention which is produced by a third embodiment of the method of producing the semiconductor memory device according to the present invention. FIG. 16 is a plan view showing an essential part of the third embodiment of the semiconductor memory device according to the present invention at an essential stage of the third embodiment of the method of producing the semiconductor memory device according to the present invention. In this embodiment, the present invention is applied to TFT load type SRAM.

In FIG. 16, those parts which are the same as those corresponding parts in FIGS. 13 through 15 are designated by the same reference numerals.

In this embodiment, the patterns of the bit lines BL and /BL on the right and left are opposite to those of the first and second embodiments described above. In other words, the transfer gate transistors which connect to the bit lines BL and /BL have an opposite arrangement compared to those of the first and second embodiments.

The above arrangement becomes possible in this embodiment because the draw out electrode 77 is formed by use of the fifth polysilicon layer.

This draw out electrode 77 extends above the word line WL. As a result, the Al bit lines BL and /BL make the necessary contact above the first polysilicon layer, that is, at a relatively shallow part. Hence, the depth of the contact hole can be reduced, and it is possible to prevent a disconnection due to poor coverage of the bit lines BL and /BL. The draw out electrode 77 having the isolated pattern couples to an impurity region of the semiconductor substrate 51.

Figure 1A:
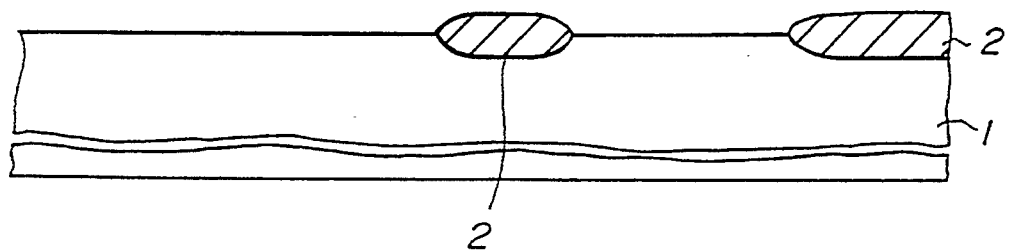
Figure 1B:
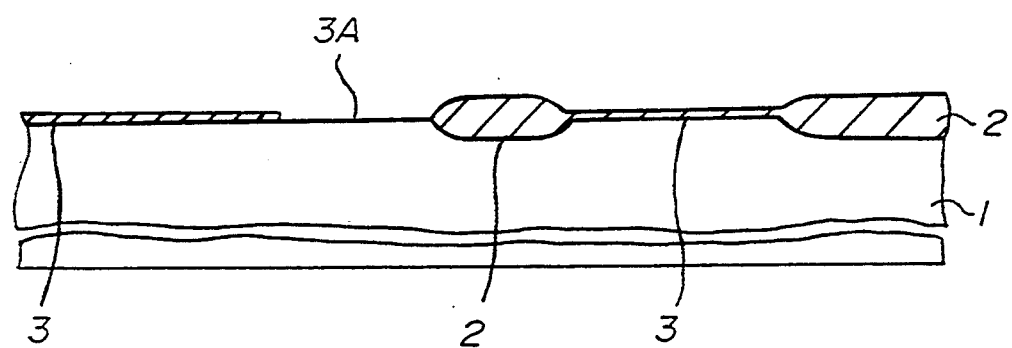
Figure 1D:
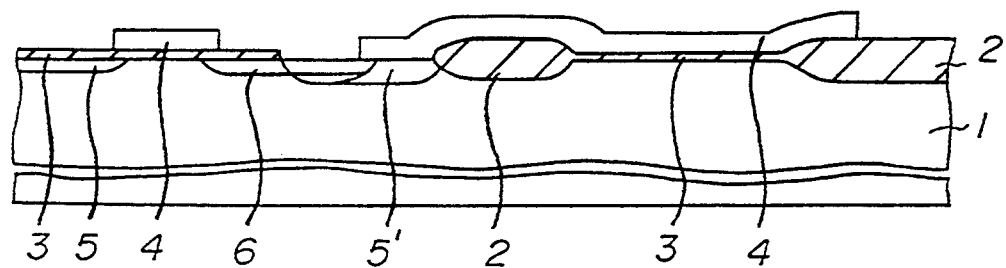
Figure 1F:
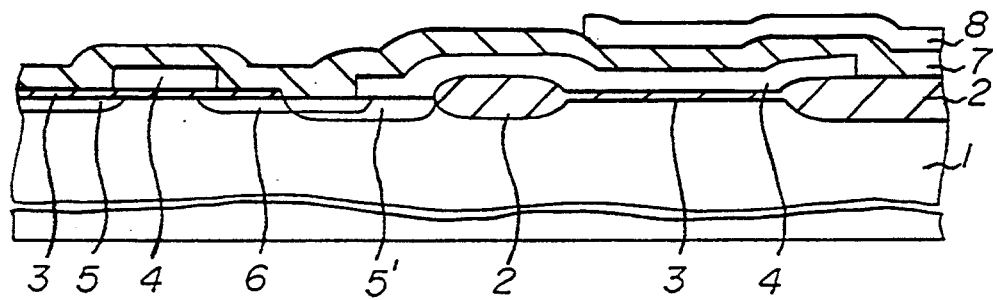
Figure 1G:
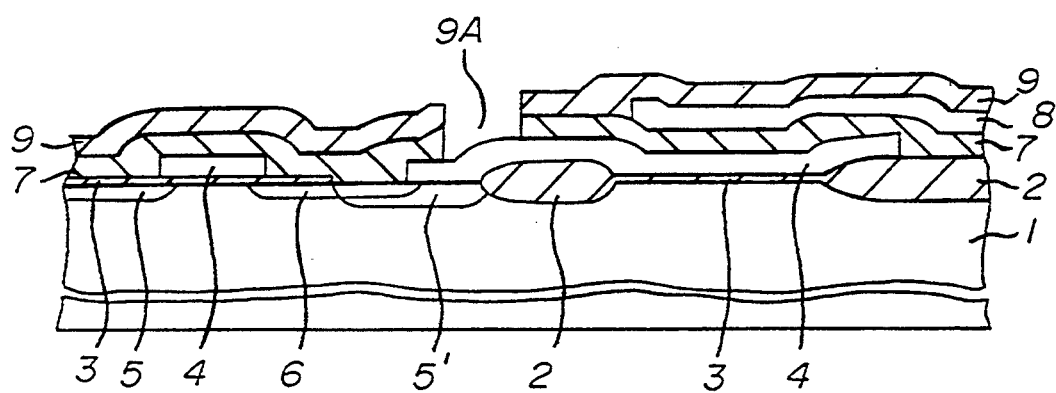
Figure 11:
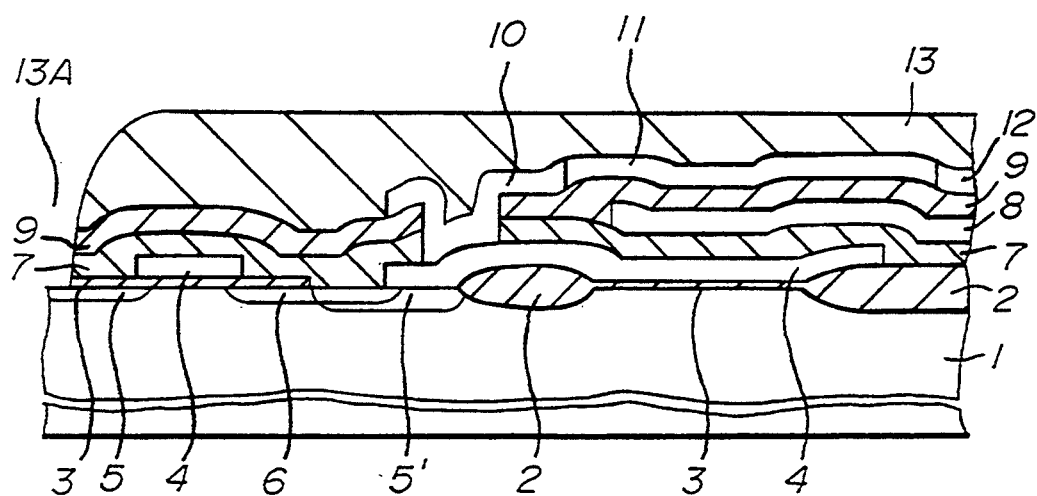
FIG. 11 is a plan view similar to FIG. 2A showing the SRAM at an essential stage of the production process thereof.
Figure 1J:
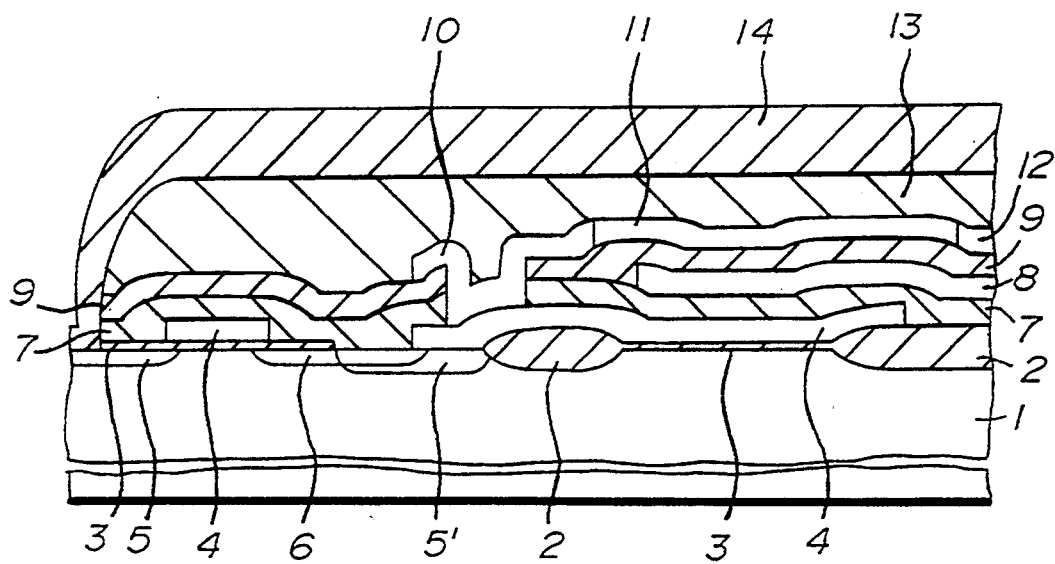
Figure 2A:
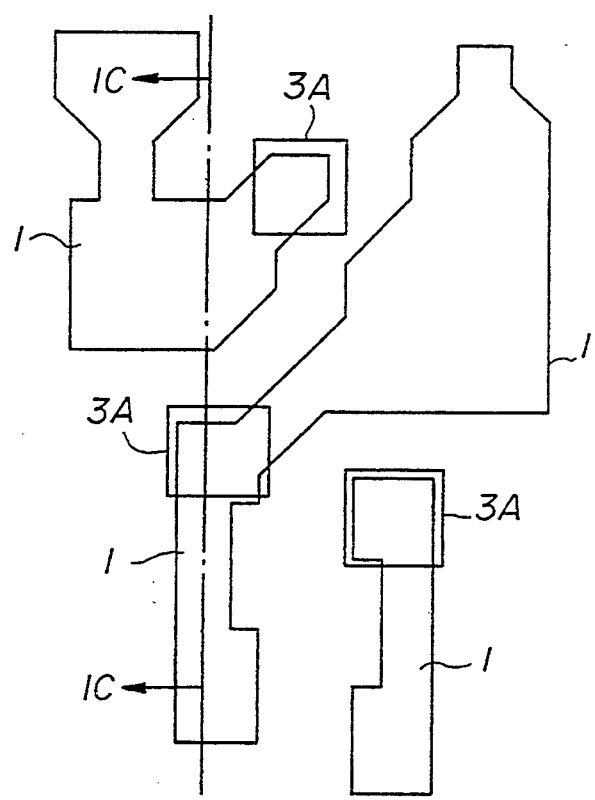
FIGS. 2A through 2F are plan views of the high resistance load type SRAM at essential stages of the conventional method of producing the high resistance load type SRAM.
Figure 2B:
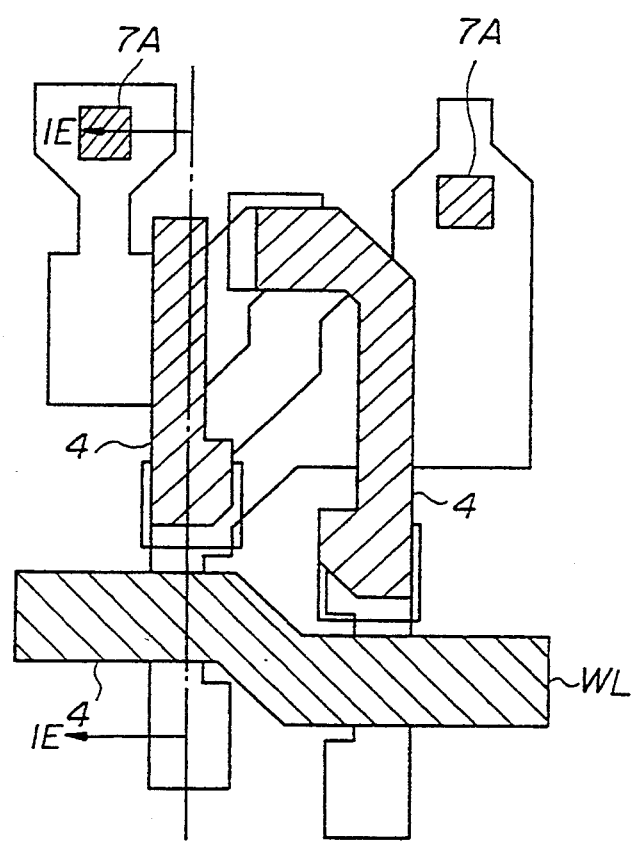
Figure 2C:
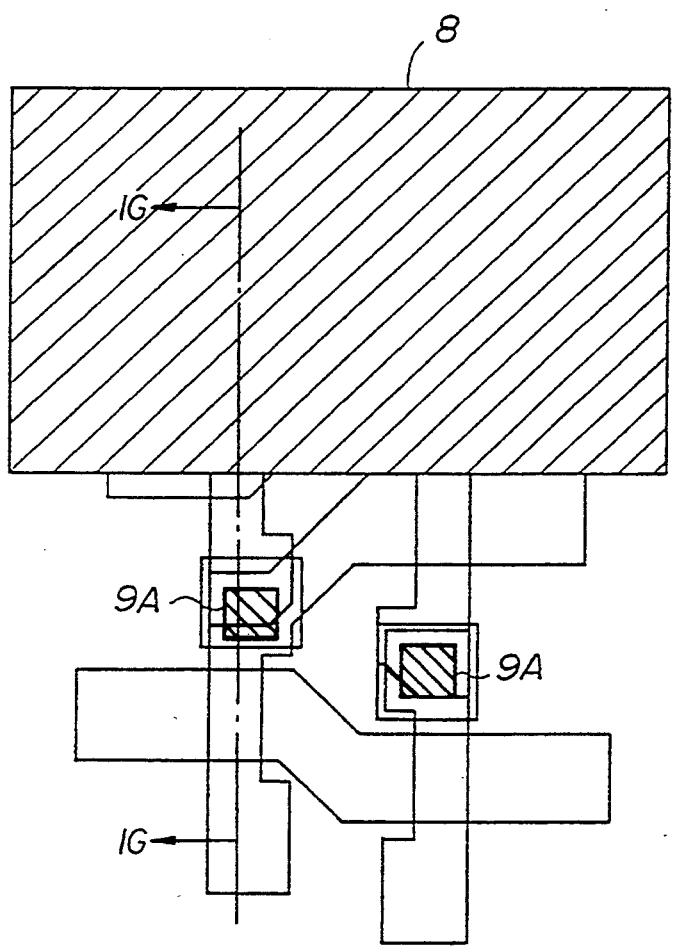
Figure 2D:
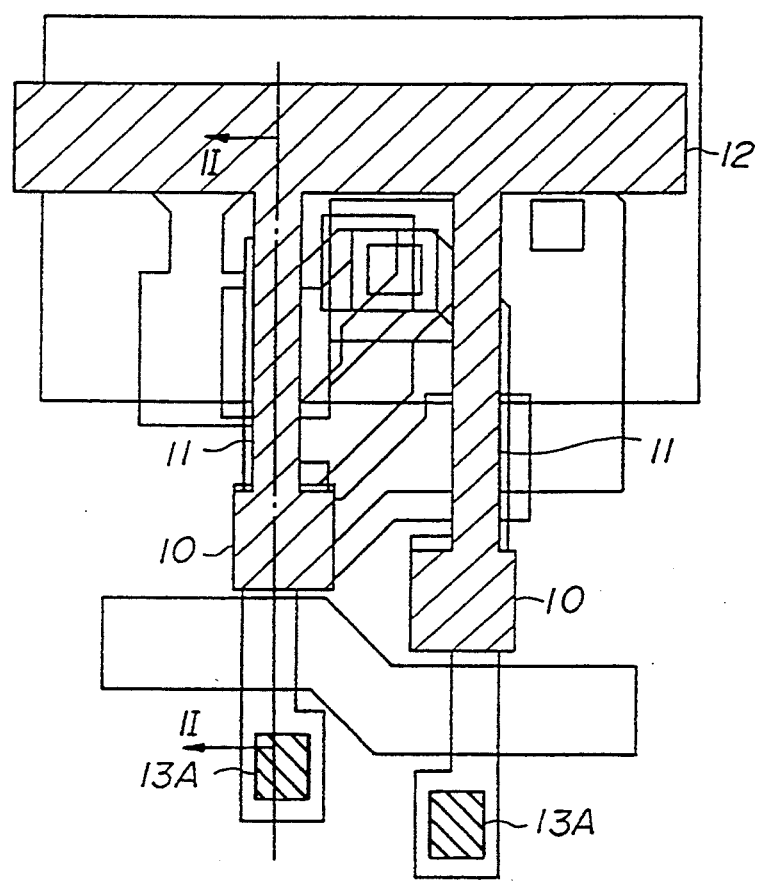
Figure 2E:
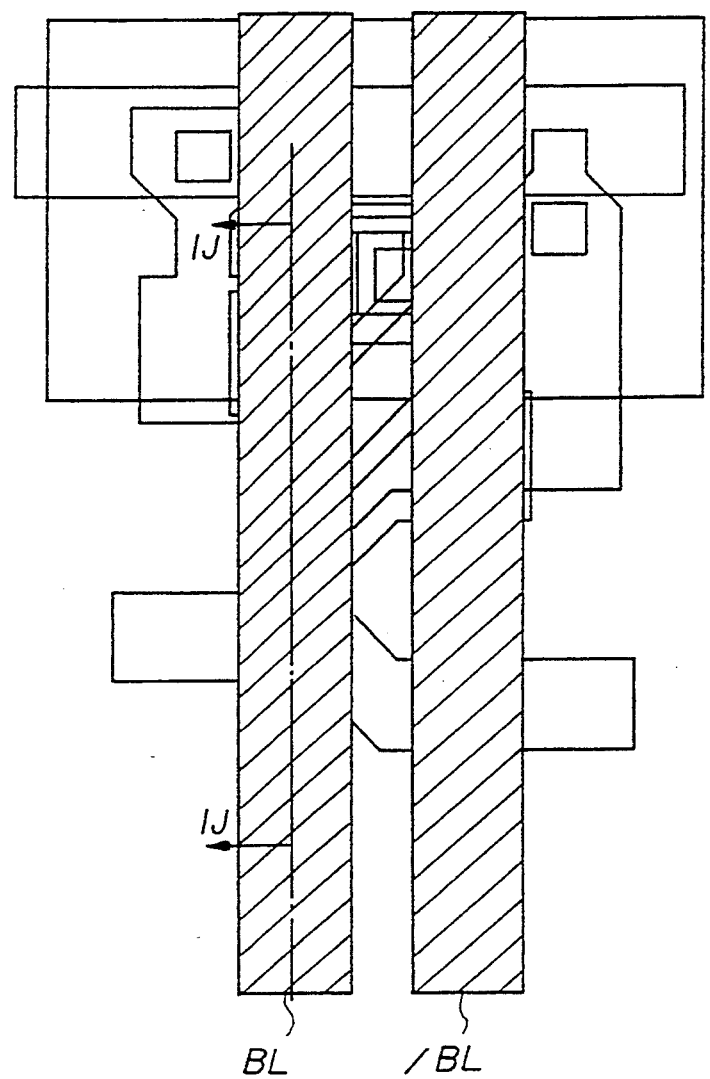
Figure 2F:
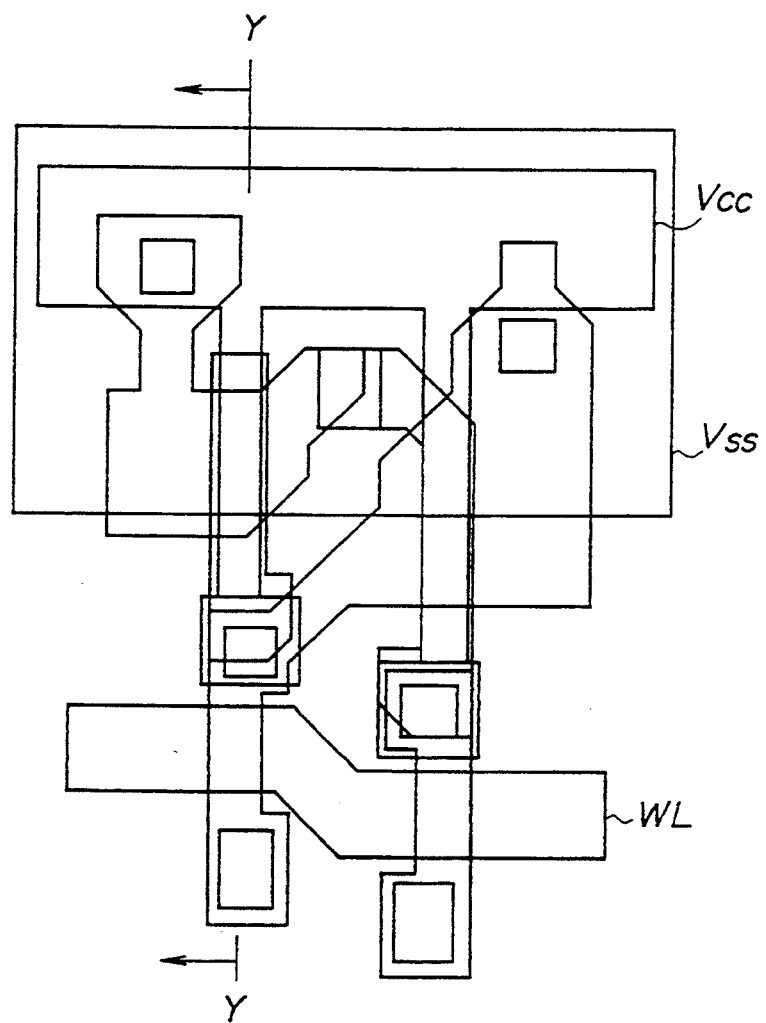
Figure 3:
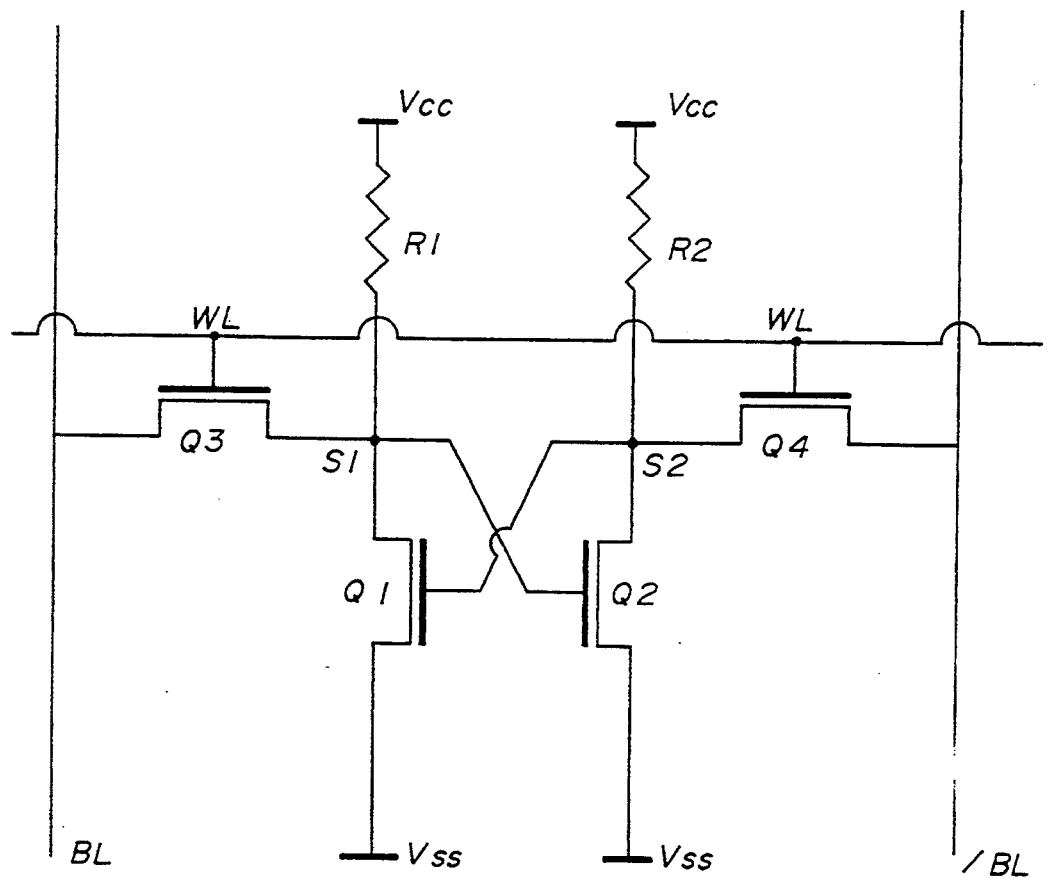
FIG. 3 shows an equivalent circuit diagram of the essential part of the high resistance load type SRAM described in conjunction with FIGS. 1A through 1J and 2A through 2F.
Figure 4A:
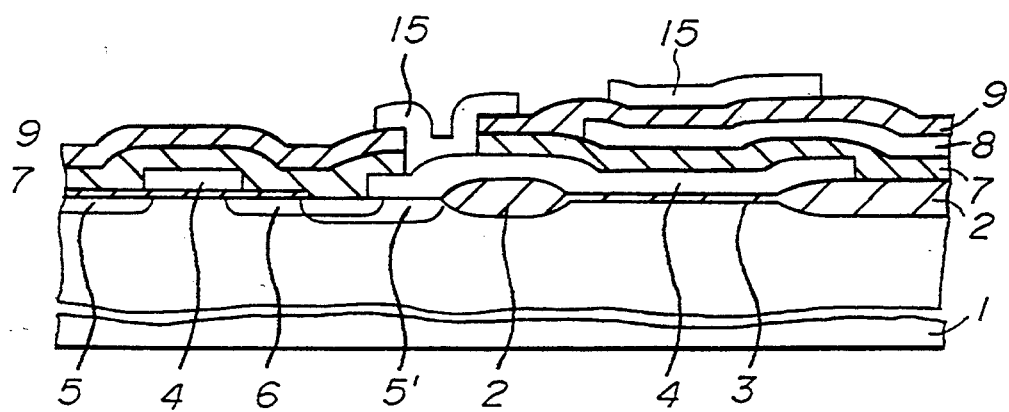
FIGS. 4A through 4D are side views in cross section showing essential parts of a TFT load type SRAM at essential stages of a conventional method of producing the high resistance load type SRAM.
Figure 4B:
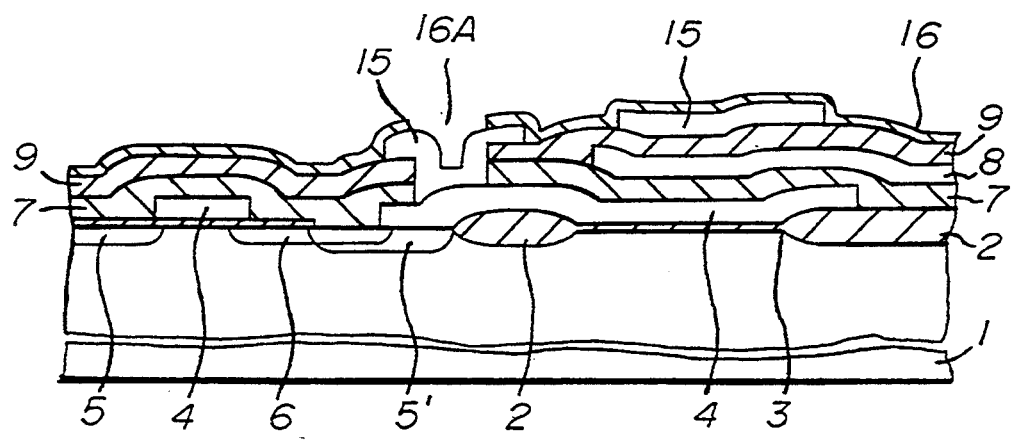
Figure 4C:
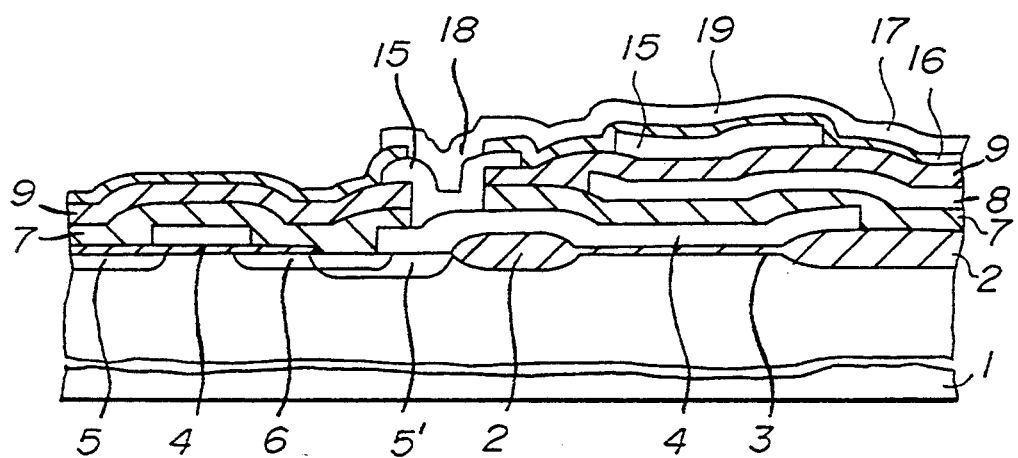
Figure 4D:
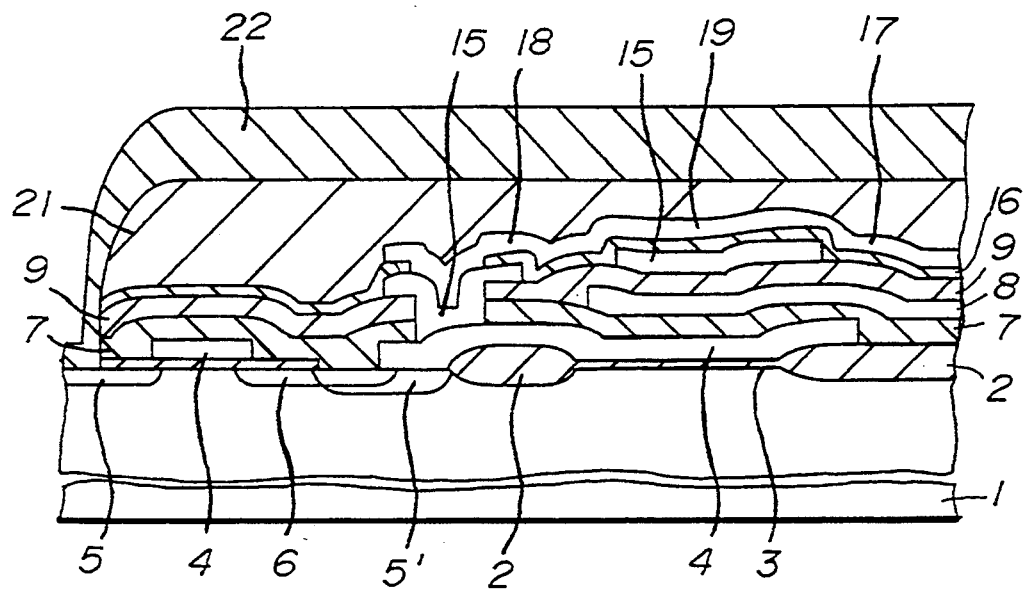
Figure 5A:
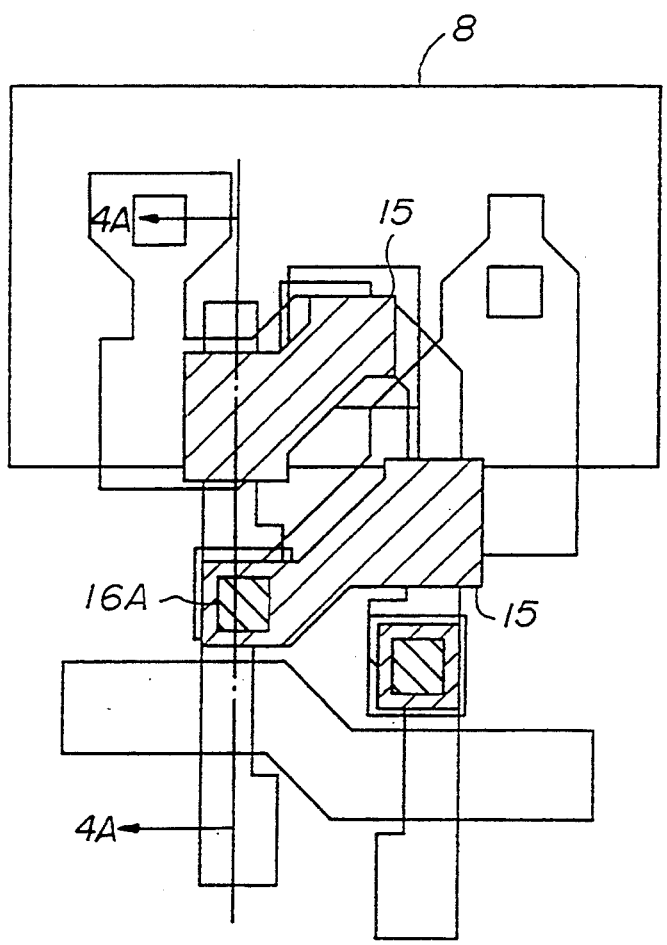
FIGS. 5A through 5D are plan views of the TFT load type SRAM at essential stages of the conventional method of producing the TFT load type SRAM.
Figure 5B:
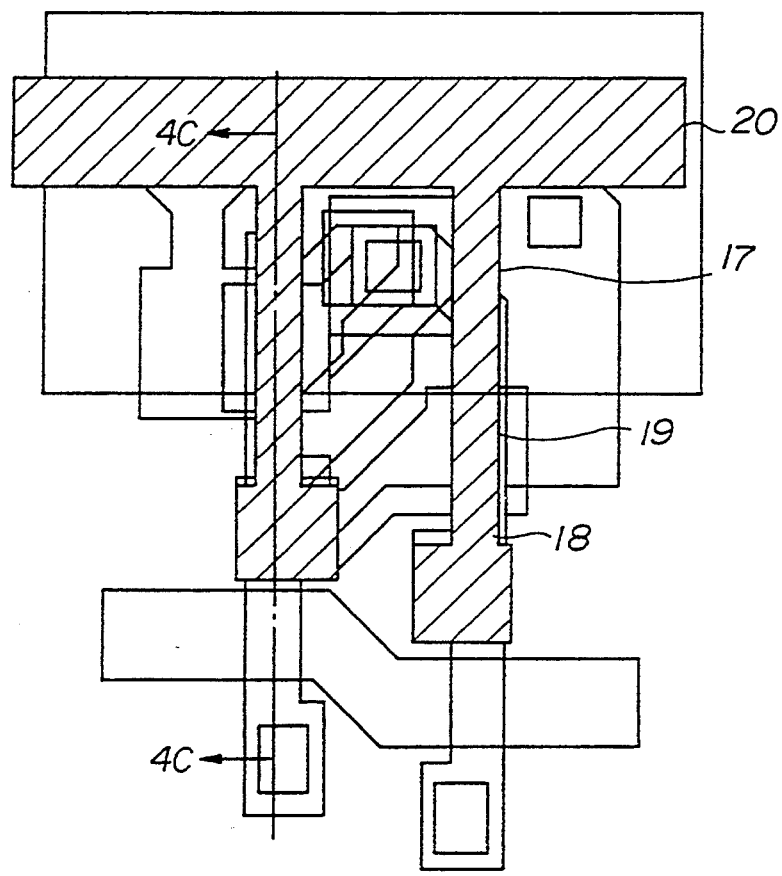
Figure 5C:
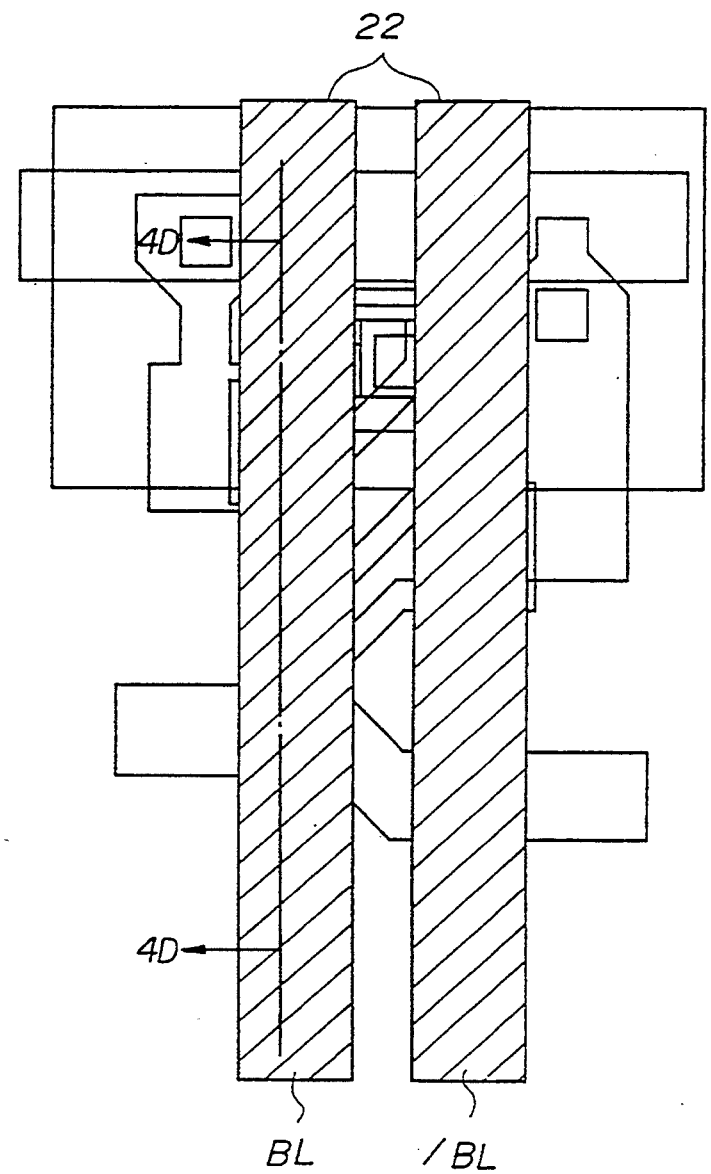
Figure 5D:
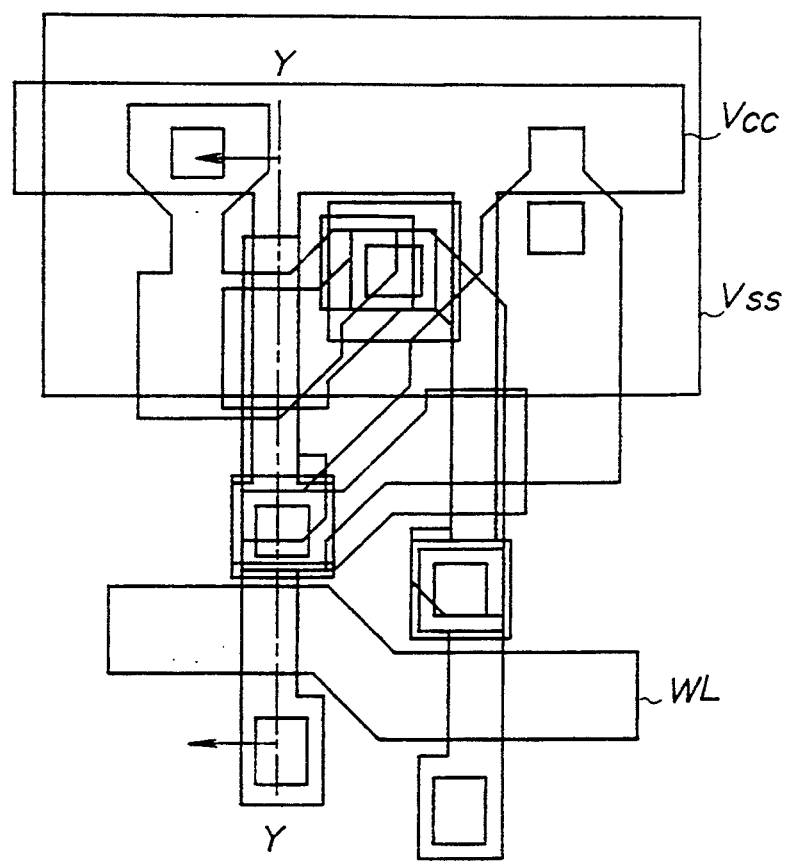
Figure 6:
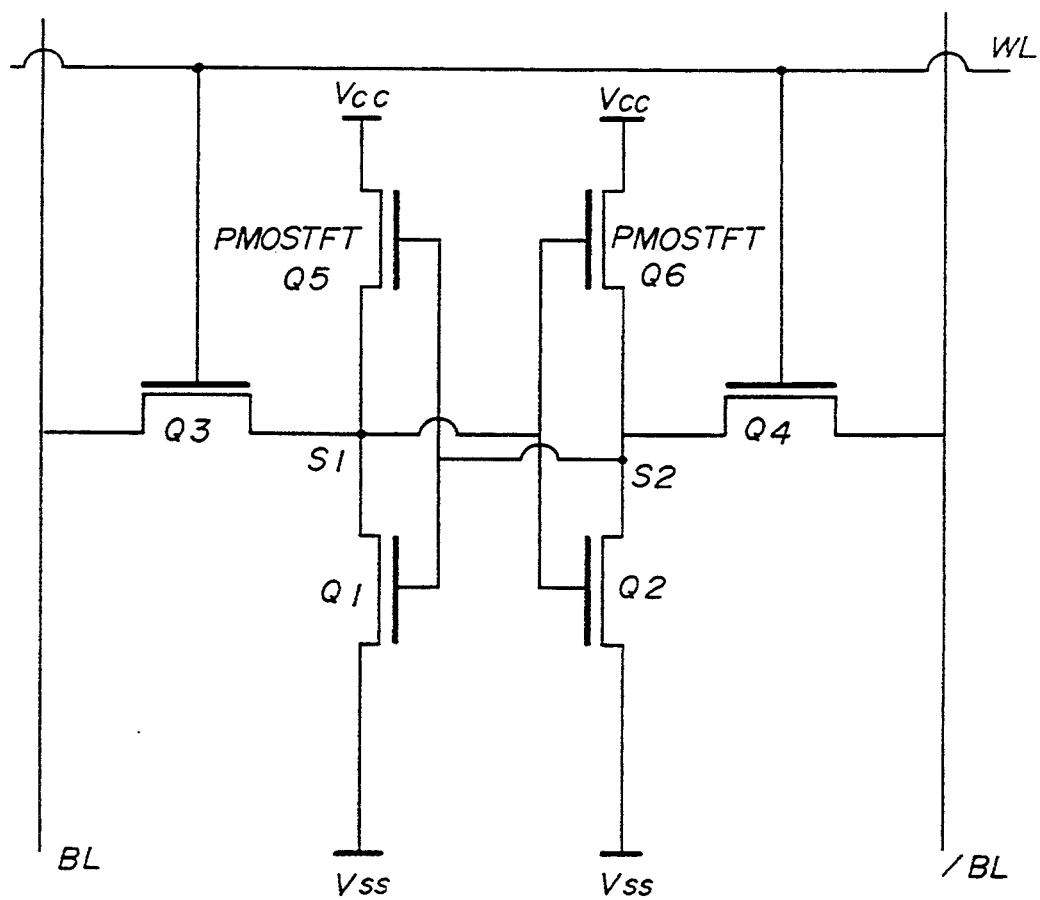
FIG. 6 shows an equivalent circuit diagram of an essential part of the TFT load type SRAM described in conjunction with FIGS. 4A through 4D and 5A through 5D.

Furthermore, as may be readily seen from the plan view of FIG. 14A and the like, the active region has a ring shape when the adjacent memory cell is included. Therefore, no dead end pattern such as that described in conjunction with FIG. 11 exists in the embodiments, and it is possible to prevent the area of the active region from being reduced by the bird's beak which is generated when forming the field insulator layer. This feature is very advantageous when forming an extremely fine element using a pattern of 1 μm or less.

In the second embodiment described above, the insulator layers made of $SiO_2$ and the polysilicon layers are etched during the process of forming the mutually connecting contact hole 72A shown in FIG. 15E. However, the following problems may occur when penetrating the stacked structure which is made up of the insulator layers and polysilicon layers.

FIGS. 17A through 17F are side views in cross section showing essential parts of a semiconductor memory device at essential stages of the production, for explaining the process of forming a contact hole which penetrates a stacked structure. In each of FIGS. 17A through 17F, the left hand side shows the result of an expected process while the right hand side shows the result of an actual process, and the description will be given mainly with reference to the right hand side of FIGS. 17A through 17F which shows the actual process.

Figure 17A:
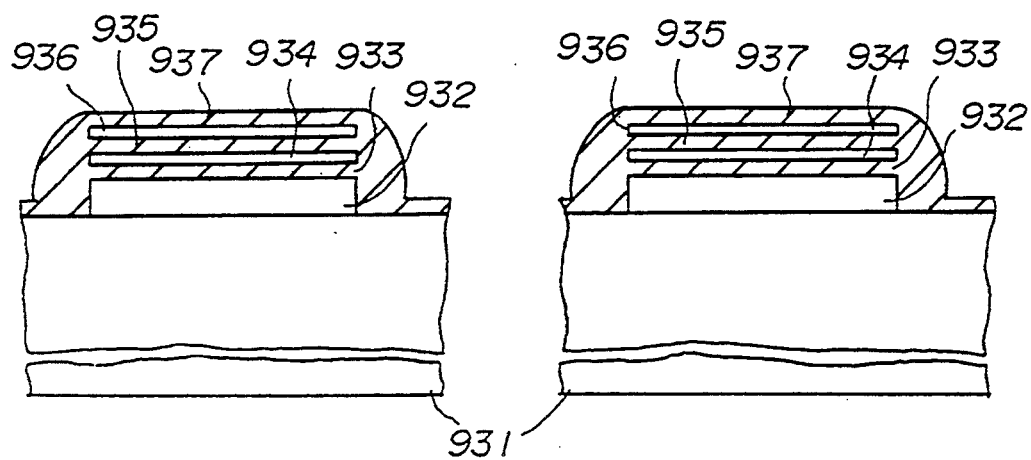
FIGS. 17A through 17F are side views in cross section showings essential parts of a semiconductor memory device at essential stages of the production, for explaining the process of forming a contact hole which penetrates a stacked structure.

In FIG. 17A, a first conductor layer 932 made of polysilicon, a first insulator layer 933 made of $SiO_2$, a second conductor layer 934 made of polysilicon, a second insulator layer 935 made of $SiO_2$, a third conductor layer 936 made of polysilicon and a third insulator layer 937 made of $SiO_2$ are successively formed and stacked on a Si semiconductor substrate 931.

Figure 17B:
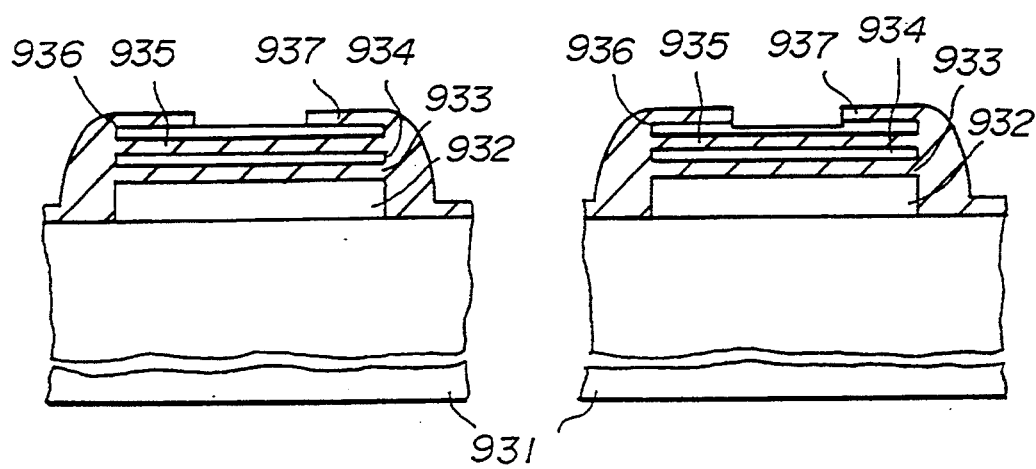

In FIG. 17B, a resist process of the normal photolithography technique and a RIE using $CHF_3$/He as the etching gas are carried out to etch the third insulator layer 937 and to form a part of a contact hole. In FIG. 17B, the illustration of a photoresist layer is omitted for the sake of convenience. The illustration of the photoresist layer will be omitted similarly in FIGS. 17C through 17F which follow.

When etching the third insulator layer 937, a part of the underlying third conductor layer 936 is also etched. As a result, the remaining third conductor layer 936 becomes extremely thin when the third conductor layer 936 is thin to start with.

Figure 17C:
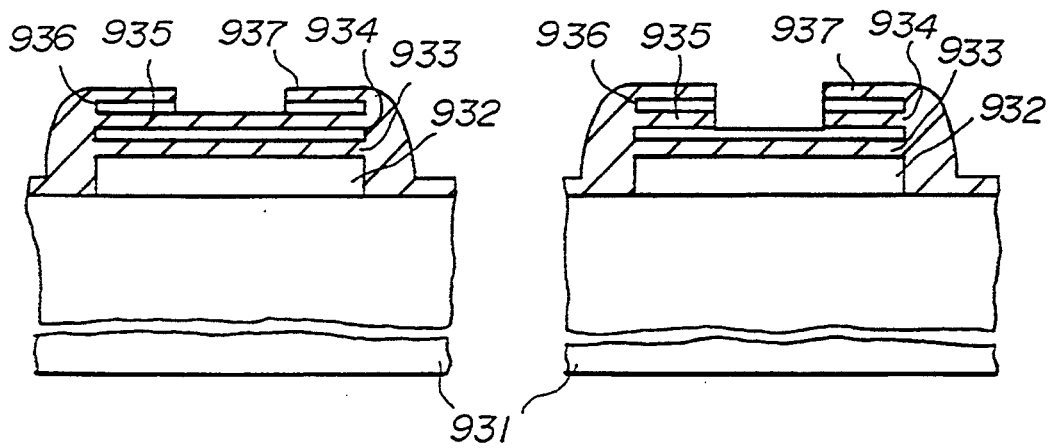

In FIG. 17C, a RIE using $CCl_4/O_2$ as the etching gas is carried out to etch the third conductor layer 936.

Although dependent on the thickness of the underlying second insulator layer 935, the thickness of the second insulator layer 935 becomes extremely thin when the third conductor layer 936 is etched. In an extreme case, not only the second insulator layer 935 but also a part of the second conductor layer 934 may be etched when etching the third conductor layer 936.

Figure 17D:
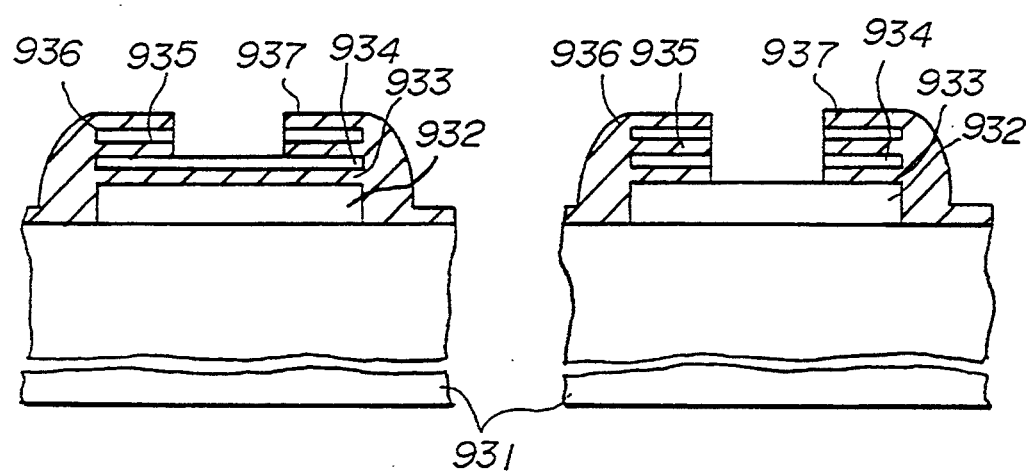

In FIG. 17D, a RIE using $CHF_3$/He as the etching gas is carried out to etch the second insulator layer 935. However, although this etching is originally intended to etch the second insulator layer 935, the second insulator layer 935 may not exist from the start of this etching, for the reasons described above.

If the second insulator layer 935 is extremely thin or does not even exist at the start of this etching, the second conductor layer 934 and the first insulator layer 933 are etched although this etching is originally intended to etch the second insulator layer 935. When the second conductor layer 934 and the first insulator layer 933 are etched, the surface of the first conductor layer 932 may become exposed by this etching which is originally intended to etch the second insulator layer 935.

Figure 17E:
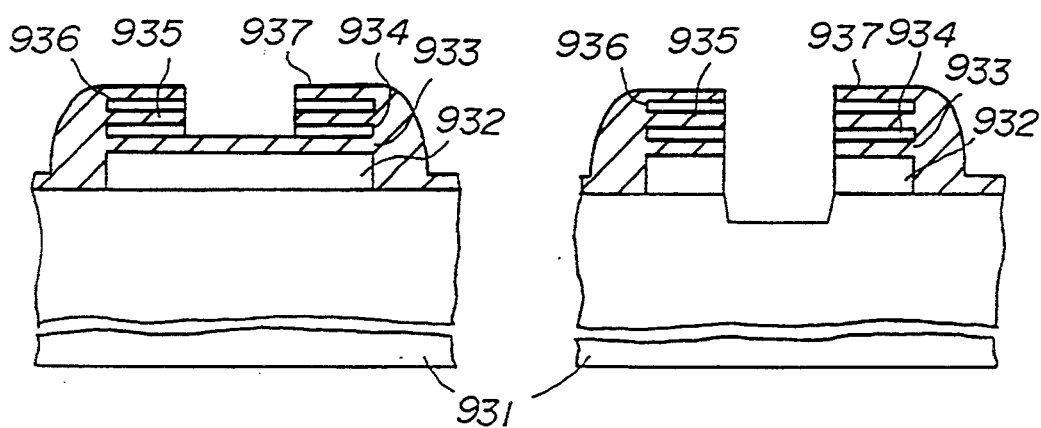

In FIG. 17E, a RIE using $CCl_4/O_2$ as the etching gas is carried out to etch the second conductor layer 934.

However, although this etching is originally intended to etch the second conductor layer 934, the surface of the first conductor layer 932 may already be exposed as described above. In this case, even a part of the Si semiconductor substrate 931 may be etched by this etching which is originally intended to etch the second conductor layer 934.

Figure 17F:
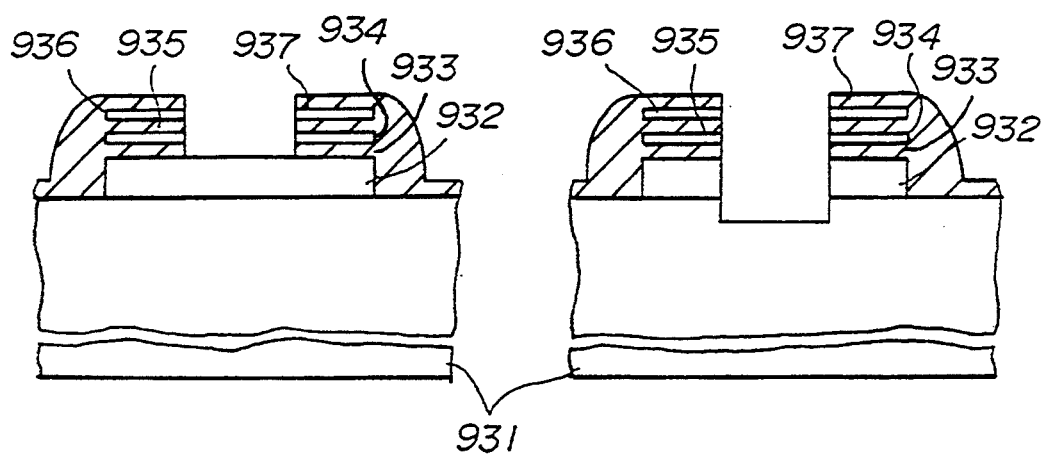

In FIG. 17F, a RIE using $CHF_3$/He as the etching gas is carried out to etch the first insulator layer 933.

But although this etching is originally intended to etch the first insulator layer 933, a part of the Si semiconductor substrate 931 may already be etched as described above. In this case, the contact hole completely extends into the Si semiconductor substrate 931 as shown in FIG. 17F.

If the contact hole extends into the Si semiconductor substrate 931 as shown in FIG. 17F, a leak is introduced at a node part between the driver transistor and the load transistor of the memory cell, and the operation of the memory cell becomes unstable. Hence, it is conceivable to carry out a moderate etching so as to etch only the originally intended layer, but such a moderate etching is impossible to control.

The etching of each layer cannot be controlled to etch only the originally intended layer by the moderate etching, because the contact hole is seldom formed at a flat part shown in FIGS. 17A through 17F. In actual practice, the contact hole is usually formed at a stepped part, and an etching residue tends to remain at the stepped part within the contact hole. However, a sufficient over-etching becomes necessary in order to remove such an etching residue.

Next, a description will be given of a fourth embodiment of the semiconductor memory device according to the present invention which is produced by a fourth embodiment of the method of producing the semiconductor memory device according to the present invention. FIGS. 18A through 18F are side views in cross section showing an essential part of the fourth embodiment of the semiconductor memory device according to the present invention at essential stages of the fourth embodiment of the method of producing the semiconductor memory device according to the present invention, for explaining the operating principle of the fourth embodiment. In each of FIGS. 18A through 18F, the left hand side shows the result of an expected process while the right hand side shows the result of an actual process, and the description will be given mainly with reference to the right hand side of FIGS. 18A through 18F which shows the actual process.

In this embodiment, measures are taken so that the contact hole will not extend into the substrate even when an over-etching is carried out to remove the etching residue within the contact hole.

Figure 18A:
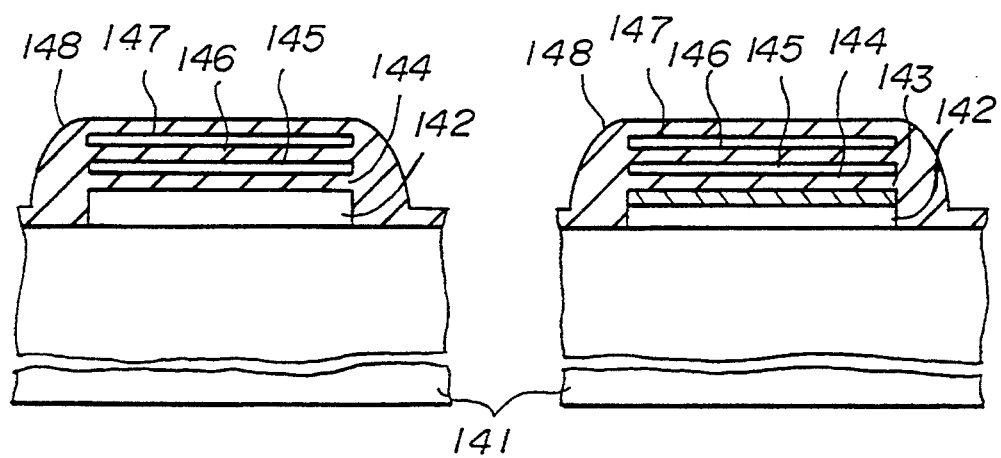
FIGS. 18A through 18F are side views in cross section showing an essential part of a fourth embodiment of the semiconductor memory device according to the present invention at essential stages of a fourth embodiment of the method of producing the semiconductor memory device according to the present invention, for explaining the operating principle of the fourth embodiment.

In FIG. 18A, a first conductor layer 142 made of polysilicon, a second conductor layer 142 made of a refractory metal such as W and WSi or a silicide thereof, a first insulator layer 144 made of SiO$_2$, a third conductor layer 145 made of polysilicon, a second insulator layer 146 made of SiO$_2$, a fourth conductor layer 147 made of polysilicon and a third insulator layer 148 made of SiO$_2$ are successively formed and stacked on a Si semiconductor substrate 141.

Figure 18B:
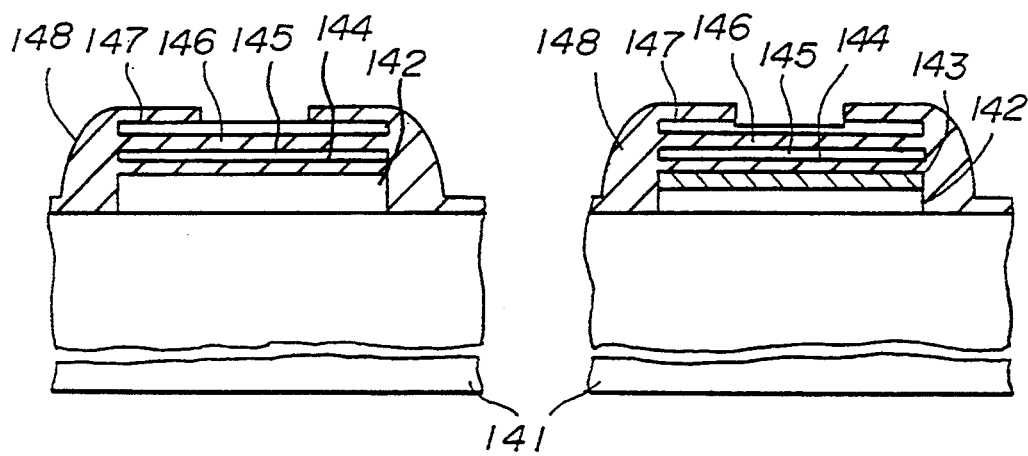

In FIG. 18B, a resist process of the normal photolithography technique and a RIE using CHF$_3$/He as the etching gas are carried out to etch the third insulator layer 148 and to form a part of a contact hole. In FIG. 18B, the illustration of a photoresist layer is omitted for the sake of convenience. The illustration of the photoresist layer will be omitted similarly in FIGS. 18C through 18F which follow.

During this process, a part of the fourth conductor layer 147 underlying the third insulator layer 148 is also etched. Accordingly, the thickness of the fourth conductor layer 147 remaining after this etching is also extremely small, similarly as in the case described above with reference to FIGS. 17A through 17F.

Figure 18C:
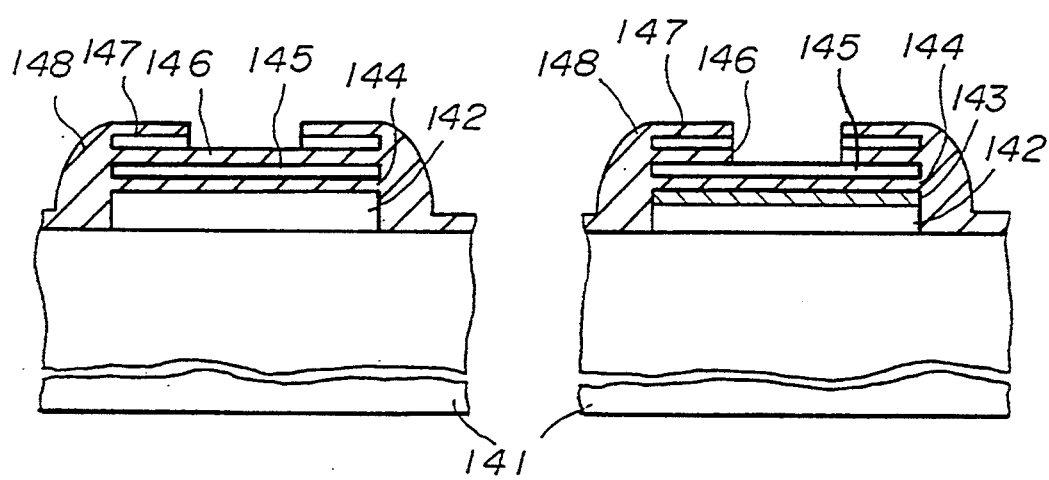

In FIG. 18C, a RIE using HBr/Ar as the etching gas is carried out to etch the fourth conductor layer 147.

In this case, although dependent on the thickness of the second insulator layer 146 underlying the fourth conductor layer 147, the thickness of the second insulator layer 146 would be reduced by this etching. In an extreme case, not only the second insulator layer 146 but also a part of the third conductor layer 145 becomes etched by this etching which is originally intended to etch the fourth conductor layer 147.

Figure 18D:
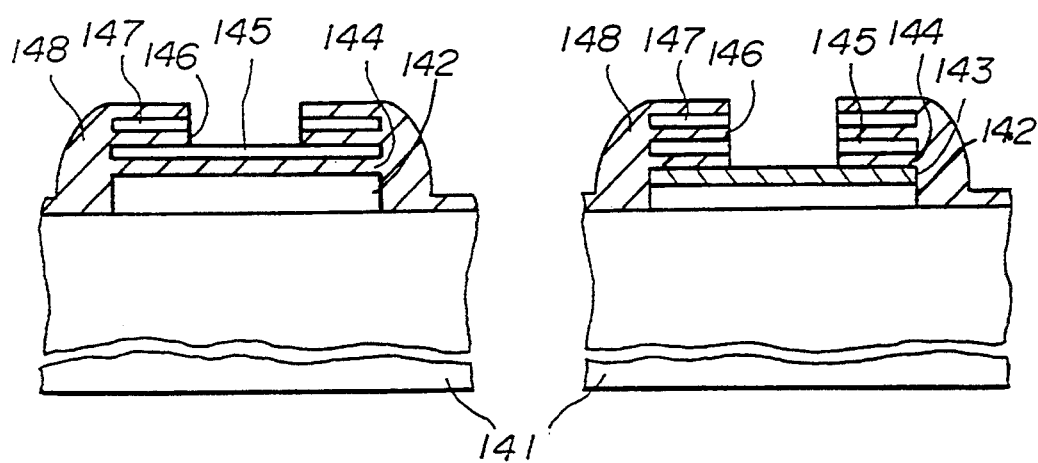

In FIG. 18D, a RIE using CHF$_3$/He as the etching gas is carried out to etch the second insulator layer 146.

However, the thickness of the second insulator layer 146 is already reduced to start with and may not even exist in an extreme case, as described above. Hence, although this etching is originally intended to etch the second insulator layer 146, the third conductor layer 145 and the first insulator layer 144 may be etched to expose the surface of the second conductor layer 143.

Figure 18E:
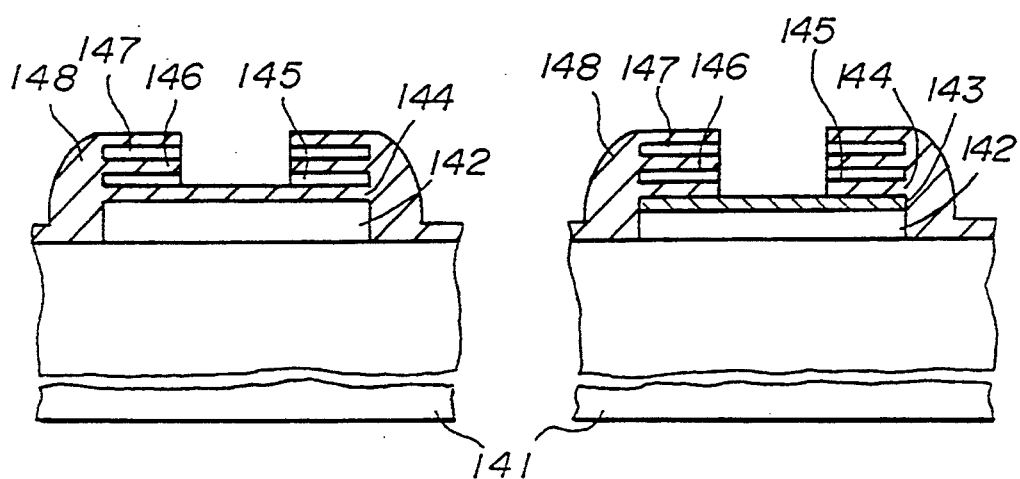

In FIG. 18E, a RIE using HBr/Ar as the etching gas is carried out to etch the third conductor layer 145.

Even though the surface of the second conductor layer 143 may already be exposed as described above when this etching is carried out, the second conductor layer 143 is made of the refractory metal or refractory metal silicide. For this reason, the second conductor layer 143 is hardly etched by this RIE which uses HBr, and no problems will be introduced by this RIE.

Figure 18F:
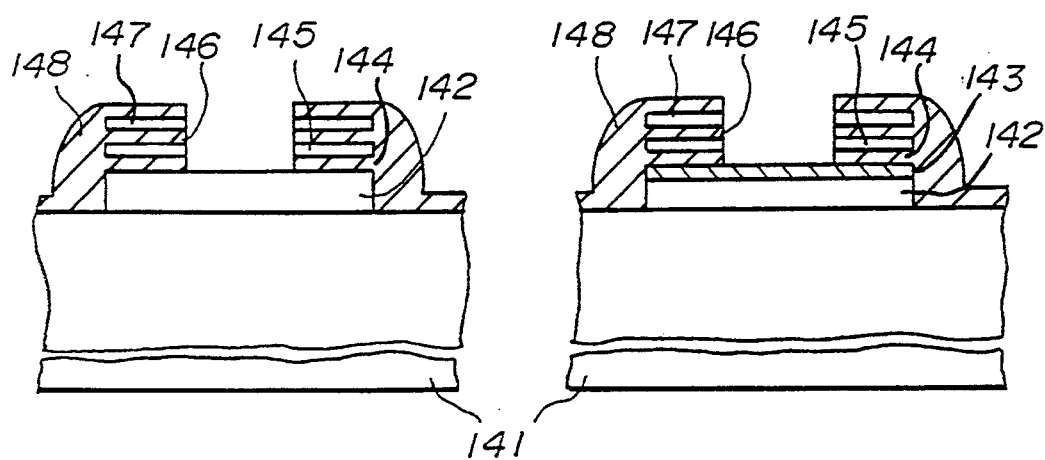

In FIG. 18F, a RIE using CHF$_3$/He as the etching gas is carried out to etch the first insulator layer 144.

The first insulator layer 144 may already be etched when this etching is started, but no adverse effects are introduced because the second conductor layer 143 is made of the refractory metal or refractory metal silicide and is hardly etched by the CHF$_3$/He etching gas.

Therefore, the contact hole is formed to an ideal shape. The only difference of the resulting contact hole shown in FIG. 18F with that shown in FIG. 17F is that the lowermost Conductor layer in FIG. 18F is made up of the first conductor layer 142 and the second conductor layer 143.

Figure 19:
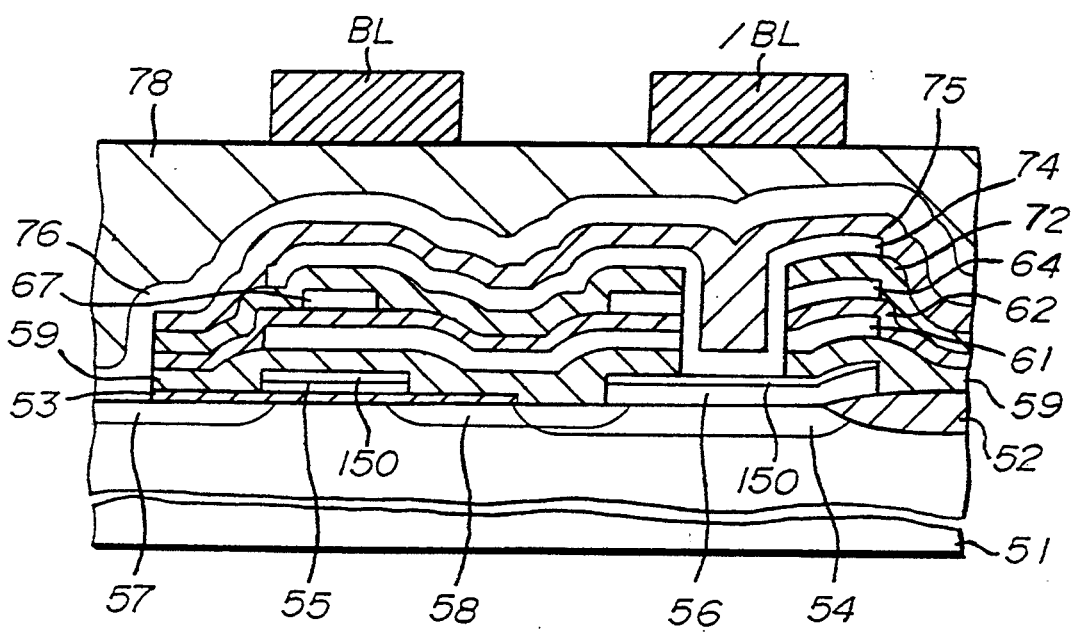
FIG. 19 is a side view in cross section showing an essential part of the fourth embodiment of the semiconductor memory device according to the present invention.

FIG. 19 shows a cross section of an essential part of the fourth embodiment of the semiconductor memory device, and in FIG. 19, those parts which are the same as those corresponding parts in FIG. 15I are designated by the same reference numerals, and a description thereof will be omitted. In this embodiment, the present invention is applied to the TFT load type SRAM.

This embodiment is basically the same as the second embodiment described above with reference to FIGS. 15A through 15I. The only difference is that the gate electrodes 55 and 56 are respectively made of the first polysilicon layer and a WSi layer 150 formed on the first polysilicon layer. Hence, the WSi layer 150 acts as a stopper when carrying out the etching to form the contact hole.

Further, the present invention is not limited to these embodiments, but various variations and modifications may be made without departing from the scope of the present invention.

What is claimed is:

1. A semiconductor memory device comprising: a semiconductor substrate;
   a memory cell formed on said semiconductor substrate and including first and second transfer transistors, first and second driver transistors and first and second thin film transistor loads; and
   first and second word lines extending generally parallel to each other along a predetermined direction and respectively coupled to gate electrodes of the first and second transfer transistors,
   each of said first and second thin film transistor loads including first and second impurity regions which sandwich a channel region formed by a semiconductor layer provided on said semiconductor substrate, and a gate electrode formed by conductor layers which sandwich said channel region and being isolated from the channel region,
   said first driver transistor including a drain which is coupled to one of the impurity regions of said first thin film transistor load and to a gate electrode of said second driver transistor via a first connection region, said second driver transistor including a drain which is coupled to one of the impurity regions of said second thin film transistor load and to a gate electrode of said first driver transistor via a second connection region, said first and second connection regions being independently provided and having the same structure, and said gate electrode of said first driver transistor and said gate electrode of said second driver transistor extending generally perpendicular to said first and second word lines.

2. The semiconductor memory device as claimed in claim 1, wherein the gate electrode of each of said first and second thin film transistor loads is made up of first and second electrode parts respectively formed above and below the channel region of each of said first and second thin film transistor loads.

3. The semiconductor memory device as claimed in claim 2, wherein the first electrode part has a thickness greater than that of the second electrode part.

4. The semiconductor memory device as claimed in claim 3, which further comprises an interconnection layer for supplying a power source voltage covering the second electrode part.

5. The semiconductor memory device as claimed in claim 1, wherein each of the first and second connection regions are provided at parts where a plurality of conductor layers and a plurality of insulator layers are alternately stacked on said semiconductor substrate, each of said first and second contact regions include a contact hole which penetrates at least one of the stacked conductor layers and reaches the gate electrode of one of said first and second driver transistors, and an uppermost one of the stacked conductor layers makes contact with side surfaces of each conductor layer exposed within the contact hole and with the gate electrode of one of said first and second driver transistors exposed within the contact hole.

6. The semiconductor memory device as claimed in claim 5, wherein the gate electrodes of said first and second driver transistors are respectively made up of a first conductor layer provided on said semiconductor substrate and a second conductor layer provided on the first conductor layer, said second conductor layer being made of a material selected from a group consisting of refractory metals and refractory metal silicides.

7. The semiconductor memory device as claimed in claim 1, which further comprises:

an interconnection for supplying a source potential to said first and second driver transistors, at least a part of said interconnection being made of a polysilicon layer which extends in the same direction as said first and second word lines;

draw out electrodes made of the same material as said interconnection and respectively having an isolated pattern; and first and second bit lines made of a metal and respectively connecting to said first and second draw out electrodes.

8. The semiconductor memory device as claimed in claim 7, wherein a part of each of said first and second draw out electrodes extends above a corresponding one of said first and second word lines, and said first and second draw out electrodes respectively connect to said first and second bit lines in vicinities of said first and second word lines.

9. A semiconductor memory device comprising:

a semiconductor substrate;

a memory cell formed on said semiconductor substrate and including first and second transfer transistors, first and second driver transistors and first and second thin film transistor loads, wherein said first and second driver transistors respectively include source and drain regions;

a field insulator layer which isolates a peripheral part of the source and drain regions of said first and second driver transistors;

adjacent memory cells which are adjacent to said memory cell;

a ring shaped active region which overlaps said memory cell and said adjacent memory cells, said source and drain regions of said first and second driver transistors having a pattern which exists within said ring shaped active region and has no dead end; and first and second word lines extending generally parallel to each other along a predetermined direction and respectively coupled to gate electrodes of the first and second transfer transistors, each of said first and second thin film transistor loads including first and second impurity regions which sandwich a channel region formed by a semiconductor layer provided on said semiconductor substrate, and a gate electrode formed by conductor layers which sandwich said channel region and being isolated from the channel region, said first driver transistor including a drain which is coupled to one of the impurity regions of said first thin film transistor load and to a gate of said second driver transistor via a first connection region, said second driver transistor including a drain which is coupled to one of the impurity regions of said second thin film transistor load and to a gate of said first driver transistor via a second connection region, and said first and second connection regions being independently provided and having the same structure.

10. The semiconductor memory device as claimed in claim 1, wherein said memory cell forms a memory cell of a static random access memory.

11. A semiconductor memory device comprising:

a semiconductor substrate;

a memory cell formed on said semiconductor substrate and including first and second transfer transistors, first and second driver transistors and first and second thin film transistor loads; and first and second word lines extending generally parallel to each other along a predetermined direction and respectively coupled to gate electrodes of the first and second transfer transistors, each of said first and second thin film transistor loads including first and second impurity regions which sandwich a channel region formed by a semiconductor layer provided on said semiconductor substrate, and a gate electrode formed by conductor layers which sandwich said channel region and being isolated from the channel region, said first driver transistor including a drain which is coupled to one of the impurity regions of said first thin film transistor load and to a gate of said second driver transistor via a first connection region, said second driver transistor including a drain which is coupled to one of the impurity regions of said second thin film transistor load and to a gate of said first driver transistor via a second connection region, and said first and second connection regions being independently provided and having the same structure, wherein each of the first and second contact regions are provided at parts where a plurality of conductor layers and a plurality of insulator layers are alternately stacked on said semiconductor substrate, each of said first and second contact regions include a contact hole which penetrates at least one of the stacked conductor layers and reaches the gate electrode of one of said first and second driver transistors, and an uppermost one of the stacked conductor layers makes contact with side surfaces of each conductor layer exposed within the contact hole and with the gate electrode of one of said first and second driver transistors exposed within the contact hole.

12. A semiconductor memory device comprising:
a semiconductor substrate;
a memory cell formed on said semiconductor substrate and including first and second transfer transistors, first and second driver transistors and first and second thin film transistor loads;
first and second word lines extending generally parallel to each other along a predetermined direction and respectively coupled to gate electrodes of the first and second transfer transistors;
an interconnection for supplying a source potential to said first and second driver transistors, at least a part of said interconnection being made of a polysilicon layer which extends in the same direction as said first and second word lines;
draw out electrodes made of the same material as said interconnection and respectively having an isolated pattern, said draw out electrodes extending in a direction generally parallel to said first and second word lines; and
first and second bit lines made of a metal and respectively connecting to said first and second draw out electrodes,
each of said first and second thin film transistor loads including first and second impurity regions which sandwich a channel region formed by a semiconductor layer provided on said semiconductor substrate, and a gate electrode formed by conductor layers which sandwich said channel region and being isolated from the channel region,
said first driver transistor including a drain which is coupled to one of the impurity regions of said first thin film transistor load and to a gate of said second driver transistor via a first connection region,
said second driver transistor including a drain which is coupled to one of the impurity regions of said second thin film transistor load and to a gate of said first driver transistor via a second connection region, and said first and second connection regions being independently provided and having the same structure.

13. A semiconductor memory device, comprising:
a semiconductor substrate;
a memory cell formed on said semiconductor substrate and including;
first and second transfer transistors, each having a gate electrode,
first and second driver transistors, each having a gate electrode and a drain, the gate electrodes of the first and second driver transistors formed of the same semiconductor layer,
a first connection region which couples the drain of the first driver transistor to the gate electrode of the second driver transistor,
a second connection region which couples the drain of the second driver transistor to the gate electrode of the first driver transistor,
first and second word lines, formed of the same semiconductor layer as the gate electrodes of the first and second driver transistors, extending generally parallel to each other along a predetermined direction and respectively coupled to the gate electrodes of the first and second transfer transistors,
first and second draw out electrodes formed of the same semiconductor layer and extending in a direction generally parallel to said first and second word lines,
first and second bit lines respectively connected to said first and second draw out electrodes, and
an interconnection region for supplying a power source potential to the first and second driver transistors, the interconnection region being formed of the same semiconductor layer as the first and second draw out electrodes;
wherein said gate electrode of said first driver transistor and said gate electrode of said second driver transistor extend generally perpendicular to said first and second word lines.

14. The semiconductor memory device as claimed in claim 13, wherein said first and second connection regions are independently provided and have the same structure.

15. The semiconductor memory device as claimed in claim 13, wherein at least a part of said interconnection region is formed of a polysilicon layer which extends in the same direction as said first and second word lines.

16. The semiconductor memory device as claimed in claim 15, wherein said first and second draw out electrodes each have a respective, isolated pattern, and said first and second connection regions are independently provided and have the same structure.

* * * * *

UNITED STATES PATENT AND TRADEMARK OFFICE
CERTIFICATE OF CORRECTION

PATENT NO. : 5,391,894
DATED : February 21, 1995
INVENTOR(S) : Kazuo ITABASHI, et al.

It is certified that error appears in the above-indentified patent and that said Letters Patent is hereby corrected as shown below:

Col. 1, line 62, after "$cm^{-3}$", insert a comma (",").
Col. 2, line 66, after "BL", insert a comma (",").
Col. 6, line 40, after "example", insert a period (".").
Col. 8, line 10, delete "Of" and insert therefor --of--.
Col. 10, line 52, delete "10ad" and insert therefor --load--.
Col. 11, line 16, delete the slash ("/") between "high" and "resistance";
 Line 55, delete the slash ("/") between "word" and "line".
Col. 12, line 45, after "x-x", insert --(13D)--.
Col. 14, lines 9 and 33, after "$cm^{-3}$", insert a comma (",").
Col. 19, line 35, delete "142" and insert therefor --143--.

Signed and Sealed this

Thirteenth Day of June, 1995

Attest:

BRUCE LEHMAN

*Attesting Officer*      *Commissioner of Patents and Trademarks*